US012790258B2

(12) United States Patent
Campion et al.

(10) Patent No.: US 12,790,258 B2
(45) Date of Patent: Nov. 10, 2026

(54) HOMOGENOUS SILICA-TITANIA GLASS

(71) Applicant: CORNING INCORPORATED, Corning, NY (US)

(72) Inventors: Michael John Campion, Corning, NY (US); Alex Gabriel Duran Buchsbaum, Ottawa (CA); Kenneth Edward Hrdina, Horseheads, NY (US); John Edward Maxon, Pulaski, NY (US); Sergey Nikolaevich Shubin, Espoo (FI); Christopher Lee Timmons, Big Flats, NY (US); Guangran Zhang, Horseheads, NY (US); Chunfeng Zhou, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 539 days.

(21) Appl. No.: 18/235,934

(22) Filed: Aug. 21, 2023

(65) Prior Publication Data

US 2024/0067558 A1 Feb. 29, 2024

Related U.S. Application Data

(60) Provisional application No. 63/401,334, filed on Aug. 26, 2022.

(30) Foreign Application Priority Data

Sep. 16, 2022 (NL) .................................... 2033057

(51) Int. Cl.
*C03C 3/06* (2006.01)
*C03C 3/076* (2006.01)
*G03F 1/00* (2012.01)

(52) U.S. Cl.
CPC ................ *C03C 3/076* (2013.01); *C03C 3/06* (2013.01); *G03F 1/00* (2013.01)

(58) Field of Classification Search
CPC .... C03C 3/06; C03C 2201/23; C03C 2201/42
See application file for complete search history.

(56) References Cited

U.S. PATENT DOCUMENTS 7,419,924 B2 9/2008 Koike et al.
8,034,731 B2 * 10/2011 Koike ....................... C03C 3/06 65/117

(Continued)

FOREIGN PATENT DOCUMENTS

EP 2247544 B1 4/2014

OTHER PUBLICATIONS

NL search Report; 2033057; dated Jul. 28, 2023; 10 pages; European Patent Office.

(Continued)

*Primary Examiner* — Noah S Wiese
(74) *Attorney, Agent, or Firm* — Amy T. Lang

(57) ABSTRACT

A glass comprising titania and silica is disclosed. A plot of average hydroxyl concentration of each segment of a plurality of segments vs. distance along the glass is provided by: $y=Ax^2+Bx+C$, wherein A (in ppm/mm$^2$) is in a range from about 0.0 to about −0.1, B (in ppm/mm) is in a range from about −10 to about 10, C (in ppm) is about 450 or less, y is the average hydroxyl concentration (in ppm), and x is distance (in mm) such that the hydroxyl concentration of each segment is measured using a Fourier transform infrared spectroscopy in transmission and the plot extends a distance of about 50 mm or more along the glass.

29 Claims, 13 Drawing Sheets

(56) References Cited

U.S. PATENT DOCUMENTS

| | | | |
|---|---|---|---|
| 8,178,450 B2 | 5/2012 | Koike et al. | |
| 8,377,612 B2 | 2/2013 | Maida et al. | |
| 9,382,150 B2 * | 7/2016 | Annamalai | C03C 3/097 |
| 9,580,350 B2 | 2/2017 | Annamalai et al. | |
| 9,932,261 B2 * | 4/2018 | Annamalai | C03B 25/02 |
| 10,732,519 B2 | 8/2020 | Becker et al. | |
| 2010/0317505 A1 | 12/2010 | Koike et al. | |
| 2015/0259239 A1 | 9/2015 | Annamalai et al. | |

OTHER PUBLICATIONS

K.M. Davis, et al., "Quantitative infrared spectroscopic measurement of hydroxyl concentration in silica glass", J. Non-Crystalline Solids, 1996, vol. 203, pp. 27-36.

* cited by examiner

15-F

| | | | | | | | | | |
|---|---|---|---|---|---|---|---|---|---|
| 145 | 149 | 149 | 149 | 150 | 151 | 153 | 153 | 154 | 152 |
| 147 | 156 | 158 | 158 | 159 | 159 | 160 | 160 | 160 | 151 |
| 146 | 157 | 161 | 162 | 163 | 162 | 162 | 162 | 159 | 147 |
| 145 | 158 | 161 | 162 | 162 | 161 | 162 | 161 | 157 | 142 |
| 144 | 157 | 161 | 162 | 162 | 160 | 160 | 160 | 156 | 139 |
| 144 | 156 | 160 | 160 | 160 | 161 | 161 | 161 | 157 | 139 |
| 145 | 156 | 160 | 160 | 160 | 161 | 161 | 161 | 157 | 140 |
| 146 | 156 | 159 | 160 | 160 | 160 | 160 | 159 | 157 | 141 |
| 146 | 154 | 155 | 156 | 156 | 157 | 157 | 156 | 155 | 143 |
| 145 | 148 | 147 | 146 | 144 | 144 | 144 | 143 | 144 | 139 |

20

FIG. 15

15-G

| | | | | | | | | | | | | | | |
|---|---|---|---|---|---|---|---|---|---|---|---|---|---|---|
| 196 | 198 | 192 | 191 | 187 | 177 | 180 | 177 | 178 | 182 | 182 | 191 | 200 | 208 | 205 |
| 208 | 212 | 213 | 213 | 215 | 212 | 214 | 214 | 215 | 215 | 215 | 216 | 216 | 214 | 207 |
| 204 | 214 | 220 | 228 | 232 | 235 | 236 | 236 | 236 | 235 | 234 | 231 | 222 | 214 | 200 |
| 195 | 215 | 227 | 235 | 243 | 245 | 247 | 248 | 248 | 247 | 246 | 240 | 231 | 217 | 192 |
| 185 | 215 | 231 | 242 | 247 | 252 | 253 | 254 | 255 | 253 | 251 | 246 | 237 | 216 | 187 |
| 195 | 223 | 244 | 252 | 254 | 259 | 261 | 262 | 262 | 261 | 253 | 247 | 237 | 215 | 181 |
| 191 | 223 | 244 | 254 | 259 | 260 | 261 | 262 | 253 | 261 | 255 | 249 | 239 | 217 | 179 |
| 188 | 222 | 244 | 255 | 260 | 262 | 262 | 263 | 263 | 259 | 256 | 252 | 240 | 217 | 179 |
| 188 | 221 | 243 | 253 | 259 | 262 | 263 | 263 | 264 | 262 | 257 | 251 | 241 | 217 | 180 |
| 188 | 219 | 240 | 250 | 256 | 259 | 261 | 263 | 263 | 262 | 256 | 251 | 240 | 217 | 183 |
| 183 | 209 | 227 | 238 | 243 | 248 | 253 | 253 | 254 | 253 | 254 | 248 | 238 | 218 | 185 |
| 187 | 209 | 221 | 229 | 237 | 241 | 243 | 243 | 244 | 244 | 246 | 241 | 234 | 218 | 191 |
| 188 | 207 | 216 | 221 | 225 | 228 | 231 | 233 | 232 | 230 | 234 | 231 | 226 | 216 | 202 |
| 193 | 205 | 205 | 205 | 205 | 208 | 207 | 208 | 208 | 207 | 215 | 214 | 215 | 215 | 207 |
| 188 | 192 | 184 | 175 | 169 | 167 | 167 | 169 | 169 | 170 | 184 | 190 | 198 | 202 | 198 |

20

FIG. 16

HOMOGENOUS SILICA-TITANIA GLASS

This application claims the benefit of priority to Dutch Patent Application No. 2033057 filed on Sep. 16, 2022, which claims the benefit of priority of U.S. Provisional Application Ser. No. 63/401,334 filed on Aug. 26, 2022, the content of which is relied upon and incorporated herein by reference in its entirety.

FIELD

This description pertains to titania-doped silica glass, and more particularly relates to titania-doped silica glass with increased homogeneity to produce a glass article. The glass article may be suitable for use in extreme ultraviolet lithography applications.

BACKGROUND

Extreme ultraviolet (EUV) lithography uses optics to illuminate, project, and reduce pattern images to form integrated circuit patterns. The use of extreme ultraviolet radiation is beneficial in that smaller integrated circuit features can be achieved. The optics for EUV lithography are currently made from low thermal expansion glass, such as silica-titania glass. The glass is traditionally made by a flame hydrolysis process in which high purity precursors are injected into flames to form fine glass particles. The fine glass particles can then be shaped into an article by axial pressing, radial pressing, or cold isostatic pressing. In such a flame hydrolysis process, the glass is formed as fine glass particles.

In EUV lithography systems, the glass is typically coated with a reflective surface to form a reflective mirror. Furthermore, the glass, in an EUV lithography system, must be able to meet stringent thermal expansion requirements in the system. Specifically, the glass must be able to maintain its surface shape (known as "figure") when subject to temperature changes in the system. A temperature stable glass is necessary to avoid any induced distortions in the wavefront characteristics of EUV projection optics.

SUMMARY

Embodiments of the present disclosure provide a glass body that is able to advantageously maintain its figure during operation of an EUV lithography system. Therefore, the glass body, according to the embodiments of the present disclosure, reduce or prevent any wavefront characteristics of EUV projection optics.

According to a first aspect, embodiments of the present disclosure are directed to a glass comprising titania and silica. A plot of average hydroxyl concentration of each segment of a plurality of segments vs. distance along the glass is provided by: $y=Ax^2+Bx+C$, wherein A (in ppm/mm$^2$) is in a range from about 0.0 to about −0.1, B (in ppm/mm) is in a range from about −10 to about 10, C (in ppm) is about 450 or less, y is the average hydroxyl concentration (in ppm), and x is distance (in mm) such that the hydroxyl concentration of each segment is measured using a Fourier transform infrared spectroscopy in transmission and the plot extends a distance of about 50 mm or more along the glass.

According to a second aspect, embodiments of the present disclosure are directed to a glass comprising titania and silica. A plot of average hydroxyl concentration of each segment of a plurality of segments vs. distance along the glass is provided by: $y=Ax^2+Bx+C$, wherein A (in ppm/mm$^2$) is in a range from about 0.0 to about −0.1, B (in ppm/mm) is in a range from about −10 to about 10, C (in ppm) is about 800 ppm or greater, y is the average hydroxyl concentration (in ppm), and x is distance (in mm) such that the hydroxyl concentration of each segment is measured using a Fourier transform infrared spectroscopy in transmission and the plot extends a distance of about 50 mm or more along the glass.

According to a third aspect, embodiments of the present disclosure are directed to a glass comprising titania and silica. A plot of average hydroxyl concentration of each segment of a plurality of segments vs. distance along the glass is provided by: $y=Ax^2+Bx+C$, wherein A (in ppm/mm$^2$) is in a range from about 0.0 to about −0.1, B (in ppm/mm) is in a range from about −10 to about 10, C (in ppm) is undefined, y is the average hydroxyl concentration (in ppm), and x is distance (in mm) such that the hydroxyl concentration of each segment is measured using a Fourier transform infrared spectroscopy in transmission and the plot extends a distance of about 50 mm or more along the glass.

Additional features and advantages will be set forth in the detailed description which follows, and in part will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims.

The accompanying drawings are included to provide a further understanding, and are incorporated in and constitute a part of this specification. The drawings are illustrative of selected aspects of the present description, and together with the specification serve to explain principles and operation of methods, products, and compositions embraced by the present description. Features shown in the drawing are illustrative of selected embodiments of the present description and are not necessarily depicted in proper scale.

BRIEF DESCRIPTION OF THE DRAWINGS

While the specification concludes with claims particularly pointing out and distinctly claiming the subject matter of the description, it is believed that the description will be better understood from the following specification when taken in conjunction with the accompanying drawings, wherein:

FIG. 12 is a schematic representation of a system to produce the glass bodies using the process of FIG. 11; and.

FIGS. 13-16 each show a cross-section of an exemplary sample of a glass body divided into segments and the hydroxyl concentration of each segment, according to embodiments disclosed herein.

DETAILED DESCRIPTION

Figure 1:
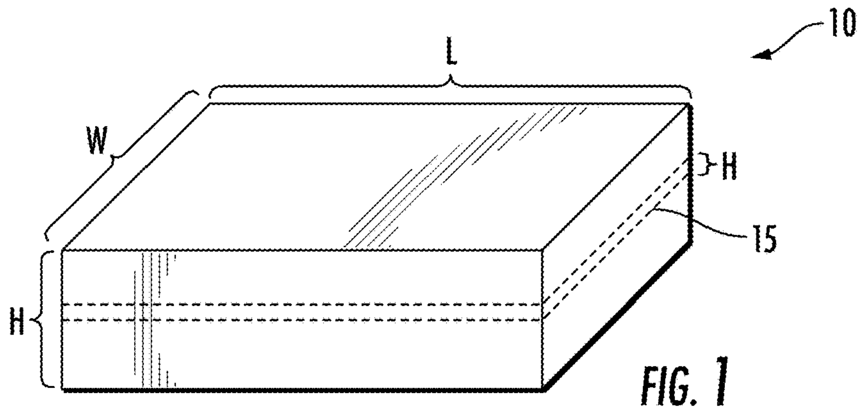
FIG. 1 shows an exemplary glass body, according to embodiments disclosed herein.

The present disclosure is directed to glass with improved homogeneity and uniformity. Embodiments of the present disclosure provide glass with substantially uniform concentrations of hydroxyl and titania across the length and width of the glass. The glass may be Ultra Low Expansion glass (ULE® Glass), manufactured by Corning Incorporated, and that is suitable for EUV applications.

EUV lithography technology relies on an optical projection system to expose a reflective photomask with EUV light, such that light reflected from the photomask is directed to a thin photosensitive layer deposited on the surface of a semiconductor wafer. This technique is commonly used in the semiconductor device production process. EUV lithography systems operate at a wavelength of light of about 13.5 nm. This extremely short wavelength poses a number of challenges to the design of the EUV systems. For example, reflective coatings on the mirror substrates in EUV systems are not able to reflect all of the light with such a low wavelength. About thirty percent of the light is absorbed by the reflective coatings, rather than reflected. The absorbed light produces undesirable heat in the mirror substrate, causing the mirror substrate to thermally expand or contract. Such changes in the mirror substrate can in turn cause the reflective coating, on the mirror substrate, to deform, which leads to distortions in the wavefront of the reflected light. Wavefront distortions may lead to deterioration in the resolution of the EUV system and errors in the patterns formed on the photosensitive layer.

Thus, the mirror substrates must be able to maintain their shape and figure even when subjected to the demanding thermal loads of EUV systems. Silica-titania glass, such as ULE® glass, is presently the material of choice for mirror substrates in EUV systems.

However, there is a need to reduce the coefficient of thermal expansion (CTE) of glass substrates in EUV systems, even for ULE® glass. A low C at room temperature is critical in allowing the shape of the glass substrate to remain substantially constant when heated in an EUV system. Modifiers may be added to glass substrates to reduce their CTE. However, such modifiers are known to decrease the homogeneity of the glass. A homogenous glass with a uniform composition is also important so that the glass can be easily polished and has favorable thermal expansion behavior over the entire glass body. For example, a glass substrate with different localized areas of titania concentration would polish unevenly, as areas with different concentrations of titanium in a glass substrate polish at different rates.

The embodiments of the present disclosure provide a homogenous glass substrate with uniform composition while maintaining an overall low CTE value. Specifically, embodiments of the present disclosure provide a glass substrate with a uniform hydroxyl concentration. Additionally or alternatively, embodiments of the present disclosure provide a glass substrate with a uniform titania concentration. Such uniform concentrations provide a glass substrate that can be easily polished while maintaining the overall low CTE value.

Another important feature for glass substrates in EUV systems is the temperature at which the CTE of the glass substrate is exactly equal to zero. This temperature is known as the zero crossing temperature and is denoted Tzc. Glass substrates in EUV systems should ideally have a Tzc value near the temperature of the glass substrate when it is exposed to the EUV light of the EUV system. When the Tzc value matches (or is close to) this temperature, the glass substrate will experience minimal expansion (and, thus, minimal figure distortion) during operation of the EUV system.

It is also noted that Tzc is directly related to the hydroxyl and titania concentration in a glass substrate (at typical fictive temperature ranges). Therefore, as the titania concentration increases, the Tzc will also increase. However, hydroxyl is inversely related to Tzc so as the h hydroxyl concentration increases, the Tzc will decrease. It is further noted that the concentration of hydroxyl has a larger effect on Tzc than the titania concentration.

As used herein, "ppm" refers to parts per million by weight.

As used herein, the term "hydroxyl(s)" or OH means a moiety or a group of moieties each consisting of an oxygen atom and a protium atom (${}_1^1H$, referred to herein as "H"), unless otherwise specified. As used herein, n(OH) means the total number of OH or hydroxyl moieties in a material.

FIG. 1 shows an exemplary glass body 10 having a length (L), a width (W), and a height (H). In some embodiments, each of the length and the width may be greater than the height (H). For example, the length (L) and the width (W) may each be about 2000 mm or less, or about 1700 mm or less, or about 1500 mm or less, or about 1200 mm or less, or about 1000 mm or less, or 700 mm or less, or about 500 mm or less, or about 450 mm or less, or about 400 mm or less, or about 350 mm or less, or about 300 mm or less, or about 250 mm or less, or about 200 mm or less, or about 150 mm or less, or about 100 mm or less, or about 75 mm or less, or about 50 mm or less, or about 25 mm or less, or about 20 mm or less, or about 15 mm or less. Additionally or alternatively the length and width of glass body 10 are each about 15 mm or greater, or about 20 mm or greater, or about 25 mm or greater, or about 50 mm or greater, or about 75 mm or greater, or about 100 mm or greater, or about 150 mm or greater, or about 200 mm or greater, or about 250 mm or greater, or about 300 mm or greater, or about 350 mm or greater, or about 400 mm or greater, or about 450 mm or greater, or about 500 mm or greater, or about 700 mm or greater, or about 1000 mm or greater, or about 1200 mm or greater, or about 1500 mm or greater, or about 1700 mm or greater, or about 2000 mm or greater. In some embodiments, both the length and the width are about 150 mm, or about 152 mm, or about 179 mm, or about 530 mm, or about 1200 mm. However, it is also contemplated that the length can be different from the width in some embodiments.

Furthermore, the height (H) may be smaller than each of the length and the width. In some embodiments, the height is about 400 mm or less, or about 350 mm or less, or about 300 mm or less, or about 250 mm or less, or about 200 mm or less, or about 150 mm or less, or about 100 mm or less, or about 75 mm or less, or about 50 mm or less, or about 25 mm or less, or about 20 mm or less, or about 15 mm or less, or about 10 mm or less, or about 5 mm or less. Additionally or alternatively, the height is about 5 mm or greater, or about 10 mm or greater, or about 15 mm or greater, or about 20 mm or greater, or about 25 mm or greater, or about 50 mm or greater, or about 75 mm or greater, or about 100 mm or greater, or about 150 mm or greater, or about 200 mm or greater, or about 250 mm or greater, or about 300 mm or greater, or about 350 mm or greater, or about 400 mm or greater. In some embodiments, the height is about 63 mm, or about 150 mm, or about 152 mm.

In embodiments, glass body 10 has a mass of 2.0 kg or greater, or about 2.5 kg, or greater, or about 5 kg or greater, or about 15 kg or greater, or about 20 kg or greater, or about 30 kg or greater, or about 50 kg or greater, or about 100 kg or greater, or about 150 kg or greater, or about 200 kg or greater or about 300 kg or greater, or about 400 kg or greater, or about 500 kg or greater.

Glass body 10 may be a substate upon which one or more additional layers or coatings may be applied. As also shown in FIG. 1, body 10 comprises at least one sub-portion, such as sample 15, having a length and a width equal to the length and width of body 10, respectively. However, the height (h) of sample 15 may be less than the height (H) of body 10. In some embodiments, the height of sample 15 is about 200 mm or less, or about 150 mm or less, or about 100 mm or less, or about 75 mm or less, or about 50 mm or less, or about 25 mm or less, or about 20 mm or less, or about 15 mm or less, or about 10 mm or less, or about 5 mm or less. In some embodiments, the height (h) is about 7.62 mm. It is also contemplated, in some embodiments, that the height (h) of sample 15 may be equal to the height (H) of body 10.

Sample 15 may be a glass body and/or a glass substrate. Body 10 (and also sample 15) may be a titania-doped silica glass. In some embodiments, body 10 may be produced by precursors comprised of, for example, octamethylcyclotetrasiloxane and titanium tetraisopropoxide. It is also contemplated that body 10 may comprise one or more additional modifiers and/or additives.

The silicon dioxide ($SiO_2$) concentration in body 10 may be about 80 wt. % or more, or about 85 wt. % or more, or about 90 wt. % or more, or about 92 wt. % or more, or about 95 wt. % or more, or about 97 wt. % or more, or about 98 wt. % or more, or about 99 wt. % or more, or from about 85 wt. % to about 97 wt. %, or from about 90 wt. % to about 95 wt. %.

As discussed above and with reference to FIG. 1, body 10 comprises at least one sample 15 that forms a sub-portion of body 10. In the embodiment of FIG. 1, sample 15 is a cross-sectional sub-portion of body 10 such that the height (h) of sample 15 extends along the height (H) of body 10. It is further noted that the height (H) of body 10 is less than its width (W) and length (L) so that sample 15 forms the cross-sectional sub-portion along the smallest dimension of body 10 (along its height (H)). The smallest dimension of body 10 may also be referred to as the characteristic length of the body, as discussed further below, so that sample 15 extends along the characteristic length of body 10. In the embodiment of FIG. 1, body 10 comprises multiple samples along its height (H). However, it is also contemplated in other embodiments, that one sample 15 extends for the entire height (H) of body 10. In these embodiments, body 10 only comprises one sample 15 such that the one sample 15 forms the entire body 10.

Although FIG. 1 depicts body 10 and sample 15 as being square components with flat surfaces, it is also contemplated in embodiments that body 10 and/or sample 15 comprise other shapes. For example, the outer profile of body 10 and/or sample 15 can be circular or elliptical or a non-symmetrical shape. Furthermore, body 10 and/or sample 15 can be curved forming a concave or convex structure. In one exemplary embodiment, body 10 is formed of a single sample 15 (such that the single sample 15 extends for the entire length, width, and height of body 10) and body 10 has a concave structure. Sample 15 may be a reticle, photomask, mirror, and/or a reticle or photomask holder.

Figure 2A:
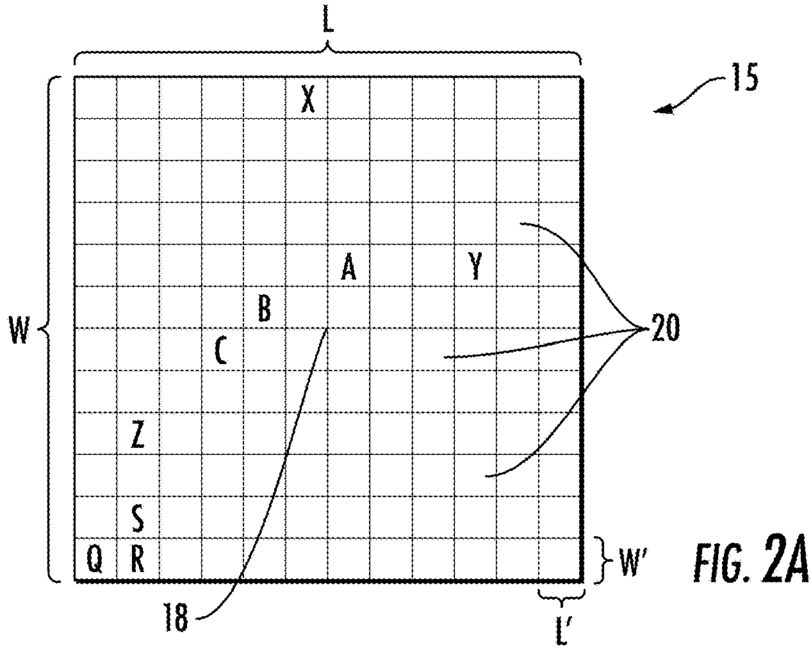
FIG. 2A shows a cross-section of a sample of the glass body of FIG. 1, according to embodiments disclosed herein.

Each sample 15 has a substantially uniform hydroxyl (OH) and titania ($TiO_2$) concentration across the length and width of the sample. In order to determine the uniformity of the samples in a body, each sample is divided into segments across the length and width of the sample. For example, FIG. 2A shows sample 15 divided into segments 20 across the cross-sectional length (L) and width (W) of sample 15. The concentration of one or more components (e.g., hydroxyl, titania) may be then determined for each segment 20 in order to determine the uniformity of each of these components along sample 15. For example, the concentration of hydroxyl may be measured for each segment 20 in order to determine the hydroxyl concentration uniformity across the cross-section of sample 15. Furthermore, the concentration of titania may be determined for each segment 20 in order to determine the titania concentration uniformity across the cross-section of sample 15. As discussed further below, the concentration of the one or more components is determined through the full thickness (h) of each segment 20.

Figure 2B:
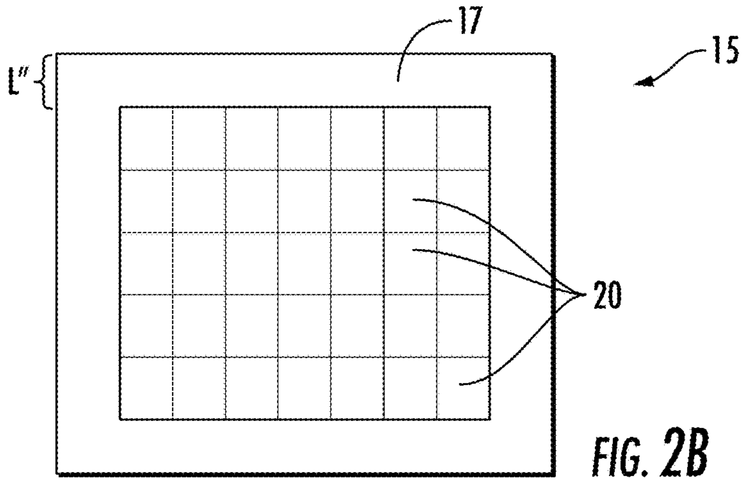
FIG. 2B shows another cross-section of a sample of the glass body of FIG. 1 with an outer, peripheral lip, according to embodiments disclosed herein.

Although FIG. 2A shows segments 20 as extending along the entire length (L) and width (W) of sample 15, it is also contemplated that the portion of sample 15 that comprises segments 20 may be less than the entire cross-sectional length (L) and width (W). For example, as shown in FIG. 2B, sample 15 may comprise an outer, peripheral lip 17 upon which segments 20 are not formed. Therefore, outer, peripheral lip 17 may be a clearance between the end of segments 20 and the outer edge of sample 15. In embodiments, the outer, peripheral lip may extend for a length (L") from about 2 mm to about 20 mm, or about 4 mm to about 16 mm, or about 5 mm to about 16 mm, or about 8 mm to about 14 mm, or about 10 mm to about 12 mm. In some embodiments, the length (L") is about 12.5 mm or about 12.7 mm.

Segments 20 may be adjacent segments across a specific length and width of sample 15 such that segments 20 span the entire area formed by this specific length and width. As discussed above, this specific length and width may be equal to or less than the length (L) and width (W) of sample 15. In embodiments, segments 20 are adjacent segments (with no gaps therebetween) across a length and width of sample 15 such that the length and width are each about 25 mm or greater, or about 30 mm or greater, or about 40 mm or greater or about 50 mm or greater, or about 60 mm or greater, or about 75 mm or greater, or about 100 mm or greater, or about 125 mm or greater, or about 150 mm or greater, or about 175 mm or greater, or about 180 mm or greater, or about 190 mm or greater, or about 200 mm or greater, or about 250 mm or greater, or about 500 mm or greater, or about 700 mm or greater, or about 800 mm or greater, or about 900 mm or greater, or about 1000 mm or greater, or about 1100 mm or greater, or about 1200 mm or greater, or about 1500 mm or greater, or about 1700 mm or greater, or about 2000 mm or greater. In some embodiments, segments 20 are adjacent segments across a length and width of sample 15 such that the length and width are each about 530 mm or about 1200 mm.

When sample 15 comprises a flat surface, segments 20 are formed along the flat planar surface, as shown in FIG. 2A. However, when sample 15 comprises a concave or convex surface, segments 20 are formed along the curving surface of sample 15.

As shown in FIG. 2A, each segment 20 has a length (L') and a width (W') that are each about 12.7 mm. However, embodiments of the present disclosure encompass other length (L') and width (W'') values and are not limited to 12.7 mm. It is also contemplated in embodiments that the length (L') is not equal to the width (W'). Furthermore, it is noted that in some embodiments, the length (L') and the width (W') of segments 20 may be equal to the length (L'') of peripheral lip 17.

The height of each segment 20 is the height (h) of sample 15, as discussed above. Therefore, in embodiments, the height h is about 7.62 mm.

As discussed above, the concentration of one or more components may be determined within each segment 20. Therefore, for example, the concentration of hydroxyl and/or the concentration of titania may be determined for each adjacent segment 20 within sample 15. When each segment 20 has a length and width of 12.7 mm, the concentration of the components is determined at a frequency of 12.7 mm across the cross-section of sample 15. For example, the concentration of hydroxyl is measured at a frequency of 12.7 mm across the cross-section of sample 15.

The concentration of hydroxyl for each segment 20 is measured using Fourier transform infrared spectroscopy ("FTIR") in transmission. As used herein, "in transmission" means that the light is directed through the glass body to be measured to determine the hydroxyl concentration (rather than using light that is reflected from the body to be measured to determine the hydroxyl concentration). Therefore, "in transmission" requires a non-scattering surface. Once sample 15 is loaded into the FTIR for measurement, a beam alignment and background measurement may be performed first. Then the FTIR measures the fundamental absorption peak for hydroxyl, which measures the peak height with respect to the background signal, the background signal being a straight line between the points surrounding the absorption peak. The absorption peak height is then divided by the thickness (h) of sample 15 to yield an absorption coefficient $\beta_{OH}$. The hydroxyl concentration is then derived from the absorption coefficient $\beta_{OH}$ using the equation:

$$C = \beta_{OH}/\varepsilon \times MW_{OH}/Dglass \times 106$$

where C is the concentration of hydroxyl in ppm for a particular segment 20, $\beta_{OH}$ is the absorption coefficient of the glass, ε is the molar absorptivity of hydroxyl for the absorption peak at a wavenumber of 3670 $cm^{-1}$, $MW_{OH}$ is the molecular weight of hydroxyl (g/mol), and D is the density of hydroxyl (g/$cm^3$). The above-disclosed FTIR analysis is further disclosed in K. M. Davis, et al, "Quantitative infrared spectroscopic measurement of hydroxyl concentration in silica glass," J. Non-Crystalline Solids, 203 (1996) 27-36, which is incorporated by reference herein. As discussed above, the hydroxyl concentration is measured for each segment 20 of sample 15 and is measured through the full thickness (h) of each segment 20. The hydroxyl concentration measurement is then repeated over all segments 20 of sample 15.

The concentration of titania of each segment 20 is calculated based upon the measured refractive index of each segment 20. More specifically, an optical interferometer operating at a wavelength of 633 nm is used to measure the refractive index. In particular, the optical interferometer is a Zygo Verifire HD from Zygo Corporation with a 270 micron pixel size resolution and operating at a wavelength of 633 nm. The optical interferometer is set so that the pixels are square with a size of 270 microns×270 microns, and each pixel extends through the full thickness (h) of sample 15. The refractive index is measured at each pixel within a segment 20 and through the full thickness of the pixel. The refractive indexes, which were each measured for each pixel within a segment 20, are then averaged together to determine the average refractive index of each segment 20. The refractive index measurement is then repeated over all segments 20 of sample 15.

The average titania concentration of each segment 20 is then determined based upon the average refractive index of each segment 20 using the following relationship:

$$55\text{ ppm } RI = 0.0125\%\ C_{Ti}$$

were RI is the average refractive index of each segment 20 and $C_{Ti}$ is the average concentration of titania (in wt. %) of each segment 20. It is noted that the above relationship assumes that the only influence on the change of refractive index is from titania.

Furthermore, the average CTE of each segment 20 is determined from the average refractive index of each segment 20 using the following relationship:

$$55\text{ ppm } RI = 1\text{ ppb/K } CTE$$

were RI is the average refractive index of each segment 20 and CTE is the average coefficient of thermal expansion (in ppb/K) of each segment 20. It is noted that the above relationship assumes that the only influence on the change of refractive index is from CTE.

Additionally, the Tzc of each segment 20 is determined from the CTE of each segment 20 using the following relationship:

$$\Delta CTE/CTE \text{ slope} = \Delta Tzc$$

where ΔCTE is the deviation of CTE for a particular segment 20 as compared to the average CTE of all the segments 20 (in ppb/K), CTE slope is the slope of CTE of all the segments 20 as a function of temperature (in ppb/$K^2$), and ΔTzc is the deviation of Tzc for the particular segment 20 as compared to the average Tzc of all the segments 20 (° C.). It is noted that the above relationship assumes that the only influence on the change of Tzc is from CTE. In the embodiments disclosed herein, the CTE slope is from about 1.0 ppb/$K^2$ to about 2.5 ppb/$K^2$, or about 1.15 ppb/$K^2$ to about 2.0 ppb/$K^2$, or about 1.2 ppb/$K^2$ to about 1.9 ppb/$K^2$, or about 1.3 ppb/$K^2$ to about 1.7 ppb/$K^2$.

One or more segments 20 may have a different concentration of one or more components from one or more other segments 20. For example, one or more segments 20 may have a different average concentration of hydroxyl from one or more other segments 20. Additionally or alternatively one or more segments 20 may have a different average concentration of titania from one or more other segments 20. In some embodiments, segments 20 closer to the center point 18 of sample 15 may have a higher concentration of hydroxyl than segments 20 closer to the peripheral edges of sample 15. As an exemplary example, segments A, B, and C in FIG. 2 may each have higher concentration of hydroxyl than segments X, Y, and Z.

In some embodiments, the concentration of hydroxyl may be in a gradient that extends radially outward along sample 15 with the highest hydroxyl concentrations near center point 18, such that the segments gradually decrease in hydroxyl concentration radially outward from center point 18. In these embodiments, the segments near center point 18 have the highest concentration of hydroxyl while the segments near the peripheral edges of sample 15 have the lowest concentration of hydroxyl.

In yet other embodiments, the segments 20 closer to a peripheral edge of sample 15 may have a higher concentration of hydroxyl than the other segments. For example, segments Q, R, and S in FIG. 2 may each have a higher hydroxyl concentration of hydroxyl than segments A, B, and C and higher than segments X, Y, and Z.

It is also contemplated, in some embodiments, that segments 20 all have the same concentration (or substantially the same concentration) of hydroxyl.

Furthermore, one or more segments 20 may have the same or different concentration of titania. In some embodiments, the concentration of titania may be the same (or substantially the same) across segments 20. Therefore, in some embodiments, the concentration of titania may be evenly distributed among segments 20.

The average concentration of each segment 20 may be averaged together to determine an average concentration across the cross-section of sample 15. For example, the average concentration of hydroxyl of each segment 20 may be measured (as discussed above) and each of these concentrations may be averaged together to determine the average hydroxyl concentration across an entirety of sample 15. More specifically, in embodiments when sample 15 comprises 144 segments 20, the hydroxyl concentrations of the 144 segments 20 are averaged together to determine the average concentration of hydroxyl of the entirety of sample 15. It is also noted that the average concentrations across sample 15 may extend for a specific length and width across sample, which are less than the entire length (L) and width (W) of sample.

According to the embodiments disclosed herein, the average hydroxyl concentration across sample 15 may be about 5 ppm or greater, or about 10 ppm or greater, or about 20 ppm or greater, or about 30 ppm or greater, or about 40 ppm or greater, or about 50 ppm or greater, or about 75 ppm or greater, or about 100 ppm or greater, or about 125 ppm or greater, or about 150 ppm or greater, or about 175 ppm or greater, or about 200 ppm or greater, or about 250 ppm or greater, or about 300 ppm or greater, or about 400 ppm or greater, or about 500 ppm or greater, or about 600 ppm or greater, or about 700 ppm or greater, or about 800 ppm or greater, or about 900 ppm or greater, or about 1000 ppm or greater, or about 1100 ppm or greater, or about 1200 ppm or greater, or about 1300 ppm or greater, or about 1400 ppm or greater, or about 1500 ppm or greater, or about 2000 ppm or greater. Additionally or alternatively, the average hydroxyl concentration across sample 15 may be about 2000 ppm or less, or about 1500 ppm or less, or about 1400 ppm or less, or about 1300 ppm or less, or about 1200 ppm or less, or about 1100 ppm or less, or about 1000 ppm or less, or about 900 ppm or less, or about 800 ppm or less, or about 700 ppm or less, or about 600 ppm or less, or about 500 ppm or less, or about 400 ppm or less, or about 300 ppm or less, or about 250 ppm or less, or about 200 ppm or less, or about 175 ppm or less, or about 150 ppm or less, or about 125 ppm or less, or about 100 ppm or less, or about 75 ppm or less, or about 50 ppm or less, or about 40 ppm or less, or about 30 ppm or less, or about 20 ppm or less, or about 10 ppm or less, or about 5 ppm or less. In embodiments, the average hydroxyl concentration is in a range from about 0 ppm to about 2000 ppm, or about 200 ppm to about 1900 ppm, or about 300 ppm to about 1800 ppm, or about 400 ppm to about 1700 ppm, or about 500 ppm to about 1750 ppm, or about 600 ppm to about 1600 ppm, or about 700 ppm to about 1500 ppm, or about 800 ppm to about 1400 ppm, or about 900 ppm to about 1300 ppm, or about 1000 ppm to about 2000 ppm, or about 1000 ppm to about 1500 ppm, or about 1000 ppm to about 1200 ppm, or about 1000 ppm to about 1100 ppm, or about 600 ppm to about 1500 ppm, or about 600 ppm to about 1400 ppm, or about 600 ppm to about 1300 ppm, or about 700 ppm to about 1000 ppm, or about 20 ppm to about 450 ppm, or about 50 ppm to about 200 ppm, or about 75 ppm to about 150 ppm, or about 80 ppm to about 125 ppm, or about 80 ppm to about 500 ppm, or about 80 ppm to about 400 ppm, or about 80 ppm to about 300 ppm, or about 80 ppm to about 200 ppm.

In some particular embodiments, the maximum hydroxyl concentration among segments 20 may be in a range from about 1000 ppm to about 1400 ppm, or from about 1000 ppm to about 1300 ppm, or from about 1000 ppm to about 1200 ppm, or from about 1000 ppm to about 1100 ppm, or from about 1050 ppm to about 1100 ppm, or from about 1060 ppm to about 1090 ppm. The minimum hydroxyl concentration among segments 20, in some particular embodiments, may be in a range from about 900 ppm to about 1300 ppm, or from about 900 ppm to about 1200 ppm, or from about 900 ppm to about 1100 ppm, or from about 1000 ppm to about 1100 ppm, or from about 1050 ppm to about 1100 ppm, or from about 1060 ppm to about 1080 ppm.

The average titania concentration across sample 15 may be from about 1.0 wt. % to about 15.0 wt. %, or from about 6.0 wt. % to about 12.0 wt. %, or from about 6.0 wt. % to about 8.5 wt. %, or from about 6.5 wt. % to about 8.0 wt. %, or from about 7.0 wt. % to about 7.7 wt. %, or from about 6.5 wt. % to about 7.8 wt. %.

The difference between the highest average concentration and the lowest average concentration of the one or more components among the different segments 20 is also determined. More specifically, the segment 20 with the highest average concentration of a particular component (e.g., hydroxyl or titania) is compared with the segment 20 with the lowest average concentration of that particular component. Then, the difference between the highest and lowest average concentrations of that particular component is calculated. This difference between the highest average concentration and the lowest average concentration in a sample 15 is referred to as the peak-to-valley (P-V) difference in average concentration.

Figure 3:
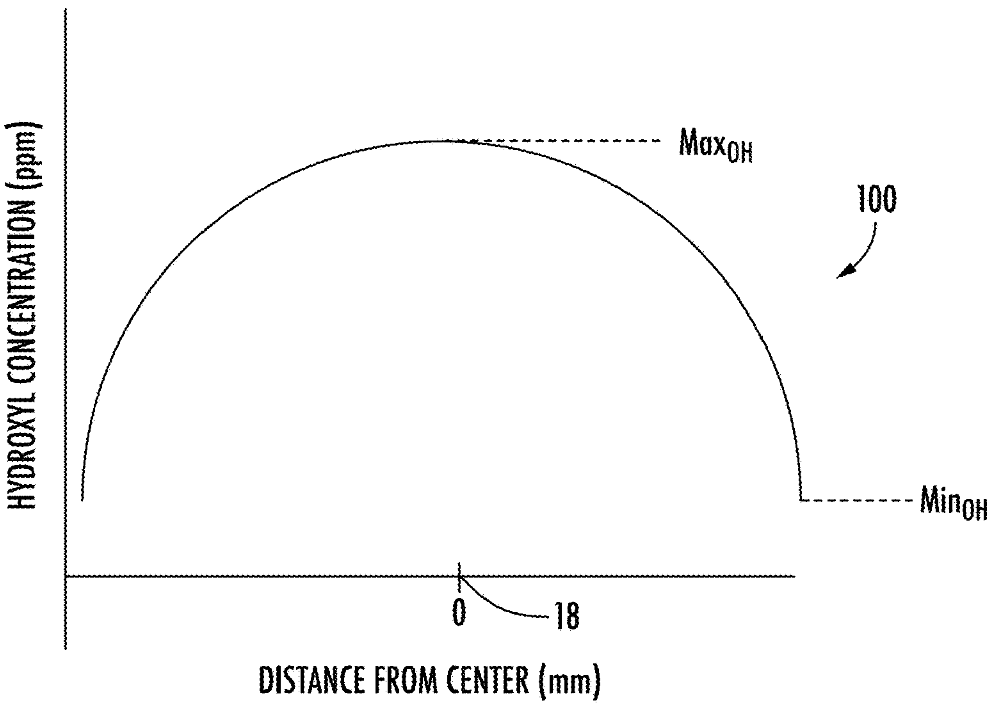
FIG. 3 depicts a plot of hydroxyl concentration vs. length of the sample of FIG. 2, according to embodiments disclosed herein.

FIG. 3 shows an exemplary plot 100 of average hydroxyl concentration of each segment radially outward from the center of a sample 15, according to embodiments disclosed herein. The plot of FIG. 3 is taken along the length of sample 15 from the center point 18 radially outwards. As shown in the exemplary embodiment of FIG. 3, the segments 20 with the highest average concentrations of hydroxyl are located near the center point 18 and the segments with the lowest average concentration of hydroxyl are located at the radially peripheral ends of sample 15. In particular, in the example shown in FIG. 3, the average concentration of hydroxyl is highest at the $Max_{OH}$ position and lowest at the $Min_{OH}$ position. Therefore, the P-V difference is the difference between the average hydroxyl concentrations at the $Max_{OH}$ and $Min_{OH}$ locations. However, as also discussed above, the distribution of hydroxyl may vary in other embodiments such that, for example, the $Max_{OH}$ position may be located at a peripheral edge of sample 15 and/or the $Min_{OH}$ position may be located near the center point 18.

The P-V difference of hydroxyl concentration of segments 20 in sample 15 may be about 70 ppm or less, or about 60 ppm or less, or about 55 ppm or less, or about 50 ppm or less, or about 45 ppm or less, or about 40 ppm or less, or about 35 ppm or less, or about 30 ppm or less, or about 25 ppm or less, or about 20 ppm or less, or about 15 ppm or less, or about 10 ppm or less, or about 5.0 ppm or less, or about 2.5 ppm or less, or about 1.0 ppm or less, or about 0.0 ppm. Additionally or alternatively, the P-V difference of hydroxyl concentration of segments 20 may be about 0.0 ppm or greater, or about 1.0 ppm or greater, or about 2.5 ppm or greater, or about 5.0 ppm or greater, or about 10 ppm or greater, or about 15 ppm or greater, or about 20 ppm or greater, or about 25 ppm or greater, or about 30 ppm or greater, or about 35 ppm or greater, or about 40 ppm or greater, or about 45 ppm or greater, or about 50 ppm or greater. In some embodiments, the P-V difference of average hydroxyl concentration of segments 20 is within a range of about 0.0 ppm to about 60 ppm, or about 10 ppm to about 50 ppm, or about 15 ppm to about 45 ppm, or about 20 ppm to about 40 ppm, or about 10 ppm to about 30 ppm.

In embodiments, the P-V difference of hydroxyl concentration of segments 20 in sample 15 is related to the size of sample 15 according to the following expression: $P\text{-}V_{OH}=Y\times L_c$, wherein $P\text{-}V_{OH}$ is the P-V of hydroxyl (in ppm) in a sample and $L_c$ is the characteristic length of the sample (in cm). As used, the characteristic $L_c$ is the smallest of the length L and width W of sample 15. Therefore, if sample 15 comprises a smaller length L than width W, its length L is the characteristic length $L_c$. Conversely, if sample 15 comprises a smaller width W than length L, its width W is the characteristic length $L_c$. In the above expression, Y (in ppm/cm) is about 1 or greater, or about 2 or greater, or about 5 or greater, or about 10 or greater, or about 20 or greater, or about 30 or greater, or about 40 or greater, or about 50 or greater, or about 60 or greater, or about 70 or greater, or about 80 or greater, or about 90 or greater, or about 100 or greater, or about 110 or greater, or about 120 or greater, or about 130 or greater, or about 140 or greater, or about 150 or greater. Additionally or alternatively, Y is about 150 or less, or about 140 or less, or about 130 or less, or about 120 or less, or about 110 or less, or about 100 or less, or about 90 or less, or about 80 or less, or about 70 or less, or about 60 or less, or about 50 or less, or about 40 or less, or about 30 or less, or about 20 or less, or about 15 or less, or about 10 or less, or about 5 or less, or about 2 or less, or about 1 or less. In embodiments, Y is in a range from about 1 to about 150, or about 2 to about 250, or about 2 to about 120, or about 3 to about 100, or about 4 to about 80, or about 5 to about 60, or about 6 to about 30, or about 7 to about 20, or about 1 to about 30, or about 2 to about 25, or about 3 to about 20, or about 1 to about 15, or about 2 to about 10, or about 5 to about 10.

Figure 4:
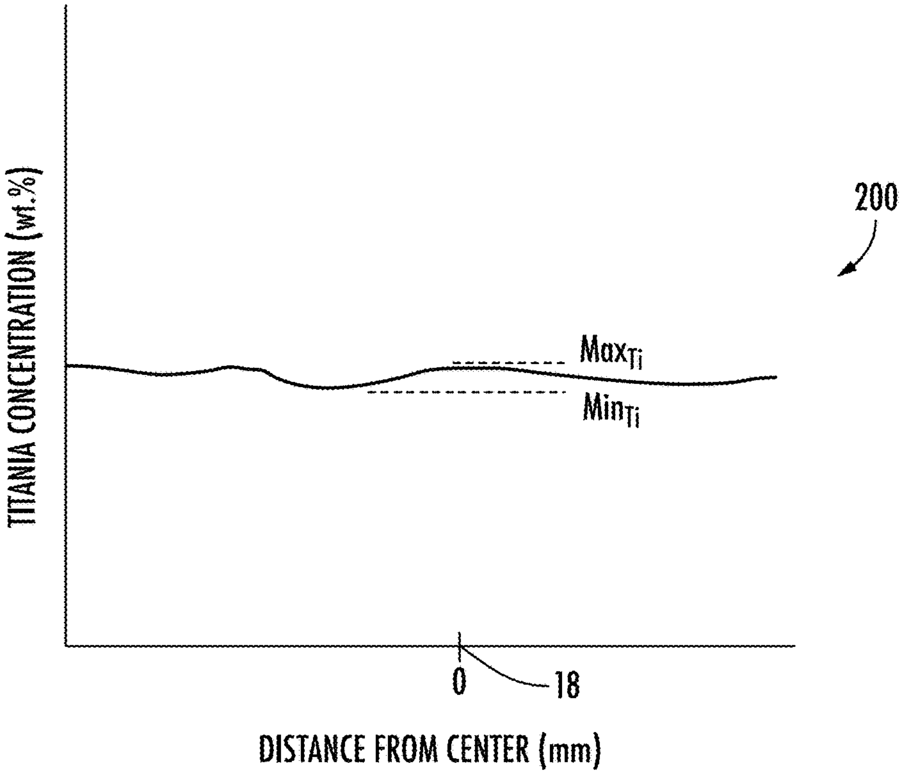
FIG. 4 depicts a plot of titania concentration vs. length of the sample of FIG. 2, according to embodiments disclosed herein.

FIG. 4 shows an exemplary plot 200 of titania concentration of each segment 20 radially outward from the center of a sample 15, according to embodiments disclosed herein. The plot of FIG. 4 is taken along the length of sample 15 from the center point 18 radially outwards (similar to that of FIG. 3). As shown in FIG. 4, the concentration of titania of segments 20 is approximately equal near the center point 18 and at the radially peripheral ends of sample 15 with little variation in the concentration of titania. However, even the small variation in the titania concentration still produces a maximum titania concentration at the $Max_{Ti}$ position and a minimum titania concentration at the $Min_{Ti}$ position. Therefore, the P-V difference is the difference between the titania concentrations at the $Max_{Ti}$ and $Min_{Ti}$ positions.

The P-V difference of titania concentration of segments 20 in sample 15 may be about 0.0040 wt. % or less, or about 0.0035 wt. % or less, or about 0.0030 wt. % or less, or about 0.0025 wt. % or less, or about 0.0020 wt. % or less, or about 0.0015 wt. % or less, or about 0.0010 wt. % or less. In embodiments, the P-V difference of titania concentration of segments 20 is in range from about 0.0010 wt. % to about 0.0050 wt. %, or about 0.0015 wt. % to about 0.0045 wt. %, or about 0.0020 wt. % to about 0.0040 wt. %, or about 0.0025 wt. % to about 0.0035 wt. %, or about 0.0030 wt. % to about 0.0050 wt. %, or about 0.0010 wt. % to about 0.0030 wt. %, or about 0.0010 wt. % to about 0.0025 wt. %, or about 0.0010 wt. % to about 0.0020 wt. %.

As discussed above, the P-V difference of concentrations of both hydroxyl and titania are very low, thus providing a homogenous glass body 10. Due to such low P-V differences, glass body 10 can be efficiently polished to provide an even surface with high flatness.

Additionally, as discussed above, the average Tzc, average refractive index, and average CTE of each segment 20 is determined. One or more segments 20 may differ in these properties from one or more other segment 20. Therefore, for example, a first segment 20 may have a different average Tzc and/or a different average refractive index from a second segment 20.

Figure 5:
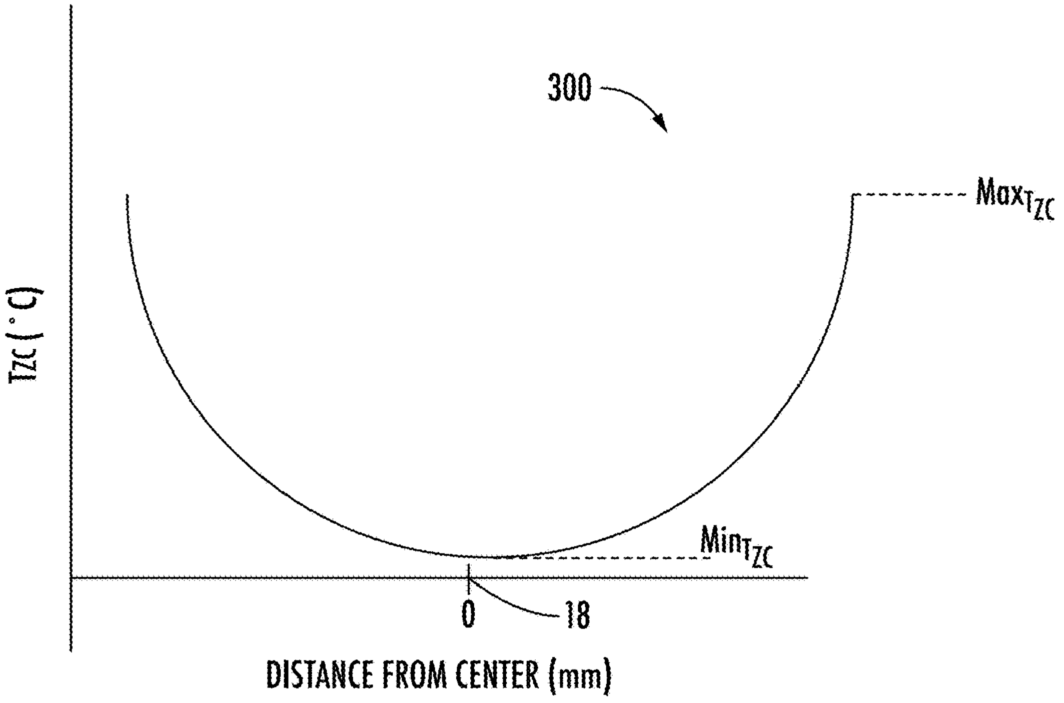
FIG. 5 depicts a plot of zero temperature crossing vs. length of the sample of FIG. 2, according to embodiments disclosed herein.

FIG. 5 shows an exemplary plot 300 of average Tzc of each segment 20 radially outward from the center of a sample 15 according to embodiments disclosed herein. The plot 300 of FIG. 4 is taken along the length of sample 15 from the center point 18 (similar to that of FIGS. 3 and 4). As shown in the exemplary embodiment of FIG. 5, the segments 20 with the lowest average Tzc are located near the center point 18 and the segments 20 with the highest average Tzc are located at the peripheral ends of sample 15. In particular, in the exemplary plot 300 shown in FIG. 5, the average Tzc is highest at the $Max_{Tzc}$ position and lowest at the $Min_{TZC}$ position. Therefore, the P-V difference is the difference between the average Tzc at the $Max_{Tzc}$ and $Min_{TZC}$ positions. However, the distribution of average Tzc may vary in other embodiments such that, for example, the $Max_{TZC}$ position may be located at a peripheral edge of sample 15 and/or the $Min_{TZC}$ position may be located at the center point 18.

The P-V difference of average Tzc in segments 20 across sample 15 may be from about 0.050° C. to about 0.300° C., or from about 0.075° C. to about 0.250° C., or from about 0.080° C. to about 0.200° C., or from about 0.100° C. to about 0.190° C., or from about 0.120° C. to about 0.180° C., or from about 0.140° C. to about 0.160° C., or from about 0.050° C. to about 0.180° C., or from about 0.100° C. to about 0.140° C.

Due to the low P-V difference of average Tzc in segments 20, glass body 10 is able to maintain its surface shape ("figure") when subject to temperature changes in an EUV lithography system.

It is also noted that when comparing FIGS. 3 and 5, the $Max_{OH}$ position is located at the $Min_{Tzc}$ position on sample 15. Therefore, in these embodiments, the segment(s) 20 with the maximum concentration of hydroxyl also have the minimum Tzc. Furthermore, in these embodiments, the segments 20 with relatively higher hydroxyl concentration have relatively lower Tzc.

The average Tzc of segments 20 across sample 15 may be in a range from about 20° C. to about 60° C., or from about 25° C. to about 55° C., or from about 30° C. to about 50° C., or from about 35° C. to about 45° C., or from about 40° C. to about 45° C., or from about 20° C. to about 45° C., or from about 20° C. to about 40° C., or from about 10° C. to about 50° C.

Figure 6:
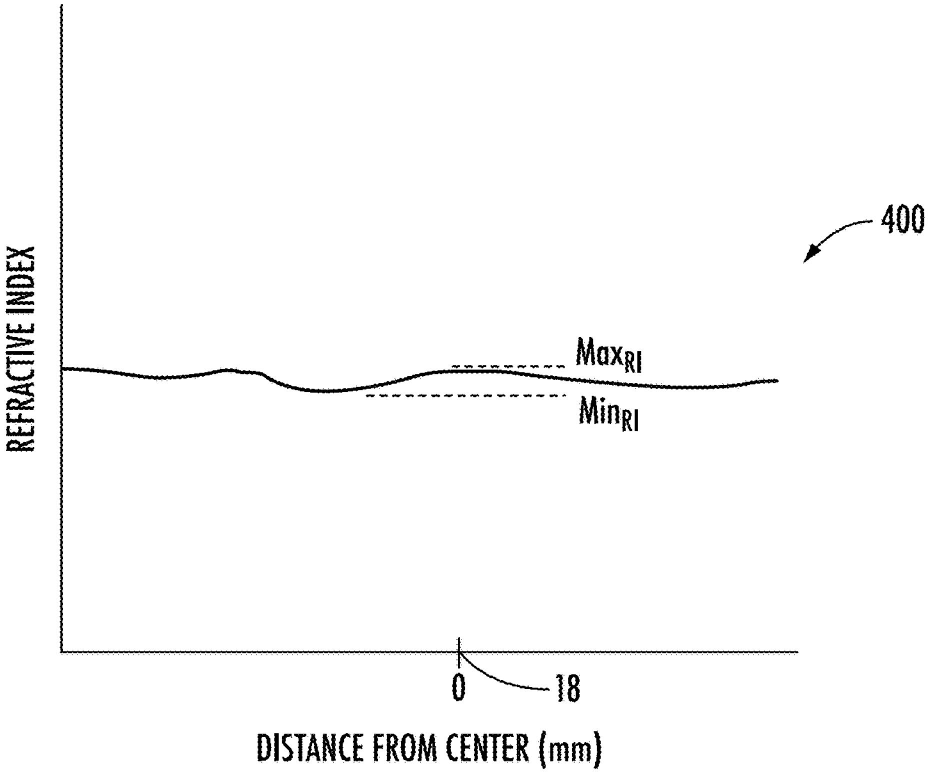
FIG. 6 depicts a plot of refractive index vs. length of the sample of FIG. 2, according to embodiments disclosed herein.

FIG. 6 shows an exemplary plot 400 of average refractive index of segments 20 radially outward from the center of a sample 15 according to embodiments disclosed herein. The plot 400 of FIG. 6 is taken along the length of sample 15 from the center point 18 (similar to that of FIGS. 3-5). Furthermore, when comparing with plot 200 (as shown in FIG. 4), the average refractive index of segments 20 across sample 15 is similar to the average concentration of titania of segments 20 across sample 15. As shown in FIG. 6, the average refractive index is approximately equal near the center point 18 and at the radially peripheral ends of sample 15 with little variation in the average refractive index. However, the small variation in the average refractive index still produces a maximum amount at the $Max_{RI}$ position and a minimum amount at the $Min_{RI}$ position. Therefore, the P-V difference is the difference between the average refractive index at the $Max_{RI}$ and $Min_{RI}$ positions.

The P-V difference of average refractive index of segments 20 across sample 15 may be about $1\times10^{-4}$ or less, or about $5\times10^{-5}$ or less, or about $1\times10^{-5}$ or less, or about $5\times10^{-6}$ or less, or about $1\times10^{-6}$ or less, or about $5\times10^{-7}$ or less, or about $1\times10^{-7}$ or less, or from about $1\times10^{-6}$ to about $1\times10^{-4}$, or about $6\times10^{-6}$ to about $9\times10^{-5}$, or about $10\times10^{-6}$ to about $6\times10^{-5}$, or about $1\times10^{-6}$ to about $1\times10^{-5}$, or about $1\times10^{-5}$ to about $1\times10^{-4}$. The distribution of refractive index within a glass body is an indicator of the titania concentration distribution of that glass body. Therefore, a glass body with a smaller P-V difference in refractive index will also have a smaller P-V difference of titania. As discussed above, a smaller P-V difference of titania allows the glass body to be more uniformly polished.

Figure 7:
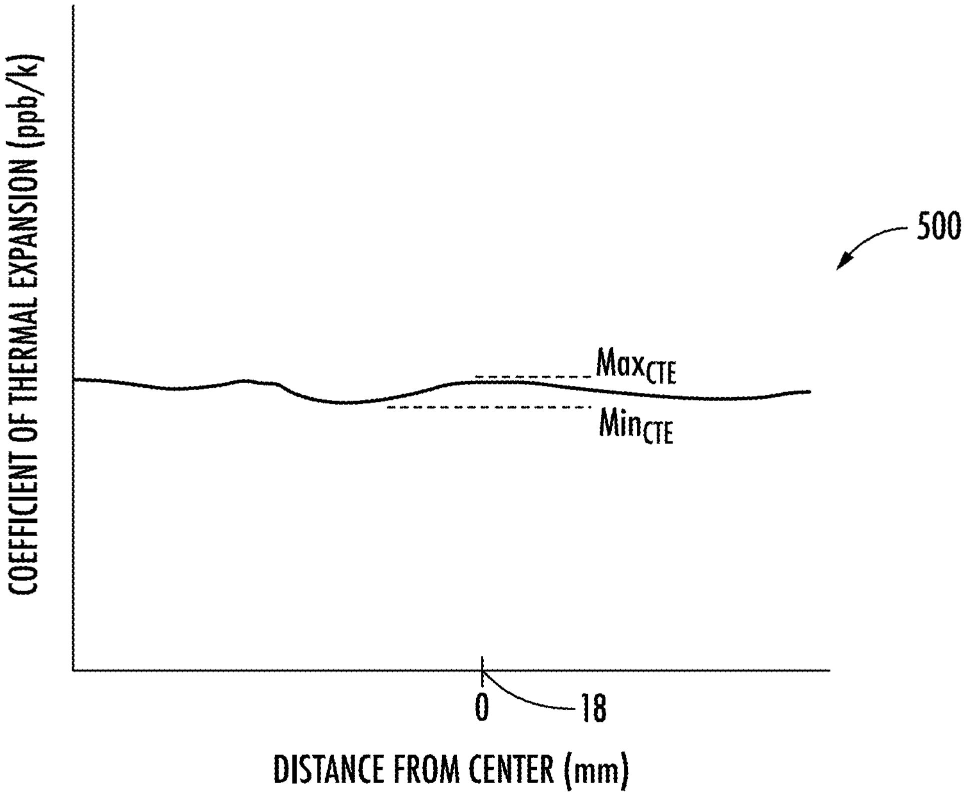
FIG. 7 depicts a plot of coefficient of thermal expansion vs. length of the sample of FIG. 2, according to embodiments disclosed herein.

FIG. 7 shows an exemplary plot 500 of average CTE of segments 20 radially outward from the center of a sample 15 according to embodiments disclosed herein. The plot 500 of FIG. 7 is taken along the length of sample 15 from the center point 18 (similar to that of FIGS. 3-6). Furthermore, when comparing with plot 200 (as shown in FIG. 4) and with plot 400 (as shown in FIG. 6), the average CTE of segments 20 across sample 15 is similar to the average concentration of titania of segments 20 and similar to the average refractive index of segments 20 across sample 15. As shown in FIG. 7, the average CTE is approximately equal near the center point 18 and at the radially peripheral ends of sample 15 with little variation in the average CTE. However, the small variation in the average CTE still produces a maximum amount at the $Max_{CTE}$ position and a minimum amount at the $Min_{CTE}$ position. Therefore, the P-V difference is the difference between the average CTE at the $Max_{CTE}$ and $Min_{CTE}$ positions.

The P-V difference of average CTE of segments 20 across sample 15 may be from about 0.30 ppb/K or less, or about 0.25 ppb/K or less, or about 0.20 ppb/K or less, or about 0.15 ppb/K or less, or about 0.12 ppb/K or less, or about 0.10 ppb/K or less, or about 0.05 ppb/K or less. In the embodiments, the P-V difference of average CTE of segments 20 across sample is in a range from about 0.05 ppb/K to about 0.25 ppb/K, or about 0.07 ppb/K to about 0.20 ppb/K, or about 0.08 ppb/K to about 0.18 ppb/K, or about 0.09 ppb/K to about 0.16 ppb/K, or about 0.10 ppb/K to about 0.15.

The average CTE of each segment 20 is about −30 ppb/K to about +30 ppb/K at a temperature between 288K and 303K. In some embodiments the CTE is about −10 ppb/K to about +10 ppb/K at a temperature between 288K and 303K, or about −5 ppb/K to about +5 ppb/K at a temperature between 288K and 303K, or about −2 ppb/K to about +2 ppb/K at a temperature between 288K and 303K.

With reference again to FIG. 3, the average hydroxyl concentration of segments 20 along sample 15 forms a parabolic curve when plotted as function of distance along sample 15. In the particular embodiment of FIG. 3, the parabolic curve is centered about center point 18 such that the curve slopes downward from this center point. However, it is also contemplated that, in other embodiments, the average hydroxyl concentration of segments 20 along sample 15 may form parabolic curves with other profiles and shapes.

In embodiments, the average hydroxyl concentration of segments 20 along a length of sample 15 forms a parabolic curve represented by the following equation:

$$y = Ax^2 + Bx + C,$$

wherein y represents the average concentration of hydroxyl (in ppm) for a particular segment 20, x represents the distance (in mm) along sample 15, A is a quadratic term and is units of ppm/mm², B is a linear term and is units of ppm/mm, and C is a constant and is units of ppm. In some embodiments, the parabolic curve has a Gaussian distribution that is symmetric about point x=0. Thus, the parabolic curve may be a bell curve. In other embodiments, the parabolic curve is not symmetric and may have other distribution functions.

In embodiments, A defines the slope and steepness of the parabolic curve and is in a range from about −20 ppm/mm$^2$ to about 20 ppm/mm$^2$, or about −15 ppm/mm$^2$ to about 15 ppm/mm$^2$, or about −10 ppm/mm$^2$ to about 10 ppm/mm$^2$, or about −5 ppm/mm$^2$ to about 5 ppm/mm$^2$, or about −2.5 ppm/mm$^2$ to about 2.5 ppm/mm$^2$, or about −20 ppm/mm$^2$ to about 5 ppm/mm$^2$, or about −20 ppm/mm$^2$ to about 2 ppm/mm$^2$, or about −20 ppm/mm$^2$ to about 0.5 ppm/mm$^2$, or about −20 ppm/mm$^2$ to about 0 ppm/mm$^2$, or about −20 ppm/mm$^2$ to about −0.1 ppm/mm$^2$, or about −20 ppm/mm$^2$ to about −0.25 ppm/mm$^2$, or about −20 ppm/mm$^2$ to about −0.5 ppm/mm$^2$, or about −10 ppm/mm$^2$ to about −0.1 ppm/mm$^2$, or about −5 ppm/mm$^2$ to about −0.1 ppm/mm$^2$, or about −2 ppm/mm$^2$ to about −0.1 ppm/mm$^2$, or about −1.8 ppm/mm$^2$ to about −0.2 ppm/mm$^2$, or about −1.6 ppm/mm$^2$ to about −0.4 ppm/mm$^2$, or about −1.2 ppm/mm$^2$ to about −0.8 ppm/mm$^2$, or about −1.8 ppm/mm$^2$ to about −1.0 ppm/mm$^2$, or about −1.6 ppm/mm$^2$ to about −1.0 ppm/mm$^2$, or about −1.0 ppm/mm$^2$ to about 1.0 ppm/mm$^2$, or about −0.5 ppm/mm$^2$ to about 0.5 ppm/mm$^2$, or about −0.25 ppm/mm$^2$ to about 0.25 ppm/mm$^2$, or about −0.2 ppm/mm$^2$ to about 0.2 ppm/mm$^2$, or about −0.2 ppm/mm$^2$ to about −0.1 ppm/mm$^2$, or about −0.2 ppm/mm$^2$ to about −0.8 ppm/mm$^2$, or about −0.2 ppm/mm$^2$ to about 0.6 ppm/mm$^2$, or about 0.0 ppm/mm$^2$ to about −0.1 ppm/mm$^2$, or about 0.0 ppm/mm$^2$ to about −0.04 ppm/mm$^2$, or about 0.0 ppm/mm$^2$ to about −0.02 ppm/mm$^2$, or about 0.0 ppm/mm$^2$ to about −0.01 ppm/mm$^2$, or about −0.01 ppm/mm$^2$ to about −0.04 ppm/mm$^2$, or about −0.01 ppm/mm$^2$ to about −0.02 ppm/mm$^2$, or about −0.02 ppm/mm$^2$ to about −0.04 ppm/mm$^2$. In some embodiments, A is about −0.2 ppm/mm$^2$, or about −1.5 ppm/mm$^2$, or about −1.6 ppm/mm$^2$, or about −1.9 ppm/mm$^2$.

In embodiments, B is in a range from about −50 ppm/mm to about 50 ppm/mm, or about −40 ppm/mm to about 40 ppm/mm, or about −30 ppm/mm to about 30 ppm/mm, or about −20 ppm/mm to about 20 ppm/mm, or about −15 ppm/mm to about 15 ppm/mm, or about −10 ppm/mm to about 10 ppm/mm, or about −5 ppm/mm to about 5 ppm/mm, or about −2 ppm/mm to about 2 ppm/mm, or about −1 ppm/mm to about 1 ppm/mm, or about −30 ppm/mm to about 10 ppm/mm, or about −25 ppm/mm to about 5 ppm/mm, or about −20 ppm/mm to about 2.5 ppm/mm, or about −15 ppm/mm to about 0 ppm/mm, or about −10 ppm/mm to about 0 ppm/mm, or about −30 ppm/mm to about 0 ppm/mm, or about −20 ppm/mm to about 0 ppm/mm, or about 0 ppm/mm to about 5 ppm/mm, or about 0 ppm/mm to about 20 ppm/mm. In some embodiments, B is about −21 ppm/mm, or about −0.1 ppm/mm, or about 0.05 ppm/mm, or about 4.8 ppm/mm.

In embodiments, C is about 2000 ppm or less, or about 1750 ppm or less, or about 1500 ppm or less, or about 1250 ppm or less, or about 1000 ppm or less, or about 750 ppm or less, or about 500 ppm or less, or about 450 ppm or less, or about 400 ppm or less, or about 350 ppm or less, or about 300 ppm or less, or about 250 ppm or less, or about 200 ppm or less, or about 150 ppm or less, or about 100 ppm or less, or about 75 ppm or less, or about 50 ppm or less, or about 25 ppm or less, or about 0 ppm. In embodiments, C is about 500 ppm or greater, or about 600 ppm or greater, or about 700 ppm or greater, or about 800 ppm or greater, or about 850 ppm or greater, or about 900 ppm or greater, or about 950 ppm or greater, or about 1000 ppm or greater, or about 1500 ppm or greater, or about 2000 ppm or greater. In embodiments, C is in range from about 0 ppm to about 2000 ppm, or about 200 ppm to about 1900 ppm, or about 300 ppm to about 1800 ppm, or about 400 ppm to about 1700 ppm, or about 500 ppm to about 1750 ppm, or about 600 ppm to about 1600 ppm, or about 700 ppm to about 1500 ppm, or about 800 ppm to about 1400 ppm, or about 800 ppm to about 1300 ppm, or about 900 ppm to about 1300 ppm, or about 1000 ppm to about 1200 ppm, or about 1000 ppm to about 1100 ppm, or about 600 ppm to about 1500 ppm, or about 600 ppm to about 1400 ppm, or about 600 ppm to about 1300 ppm, or about 700 ppm to about 1000 ppm, or about 700 ppm to about 1300 ppm, or about 800 ppm to about 1200 ppm, or about 900 ppm to about 1100 ppm, or about 1000 ppm to about 1200 ppm, or about 1000 ppm to about 1100 ppm, or about 40 ppm to about 1300 ppm, or about 40 ppm to about 1100 ppm, or about 40 ppm to about 900 ppm, or about 50 ppm to about 200 ppm, or about 75 ppm to about 150 ppm, or about 80 ppm to about 125 ppm, or about 50 ppm to about 250 ppm, or about 75 ppm to about 200 ppm, or about 100 ppm to about 175 ppm, or about 100 ppm to about 150 ppm, or about 75 ppm to about 450 ppm, or about 80 ppm to about 400 ppm, or about 80 ppm to about 300 ppm, or about 80 ppm to about 200 ppm, or about 80 ppm to about 150 ppm. In some embodiments, C is about 1030 ppm, or about 1078 ppm, or about 1080 ppm, or about 1140 ppm, or about 80 ppm, or about 50 ppm. It is also contemplated that in embodiments disclosed herein, C may be undefined such that C can be any value is not limited by any specific range.

In the above parabolic curve, x is the distance along sample 15 (in mm) from the x=0 point. Therefore, x can be anywhere along the length of sample 15 such that the above parameters of A, B, and C are satisfied. In the exemplary plot 100 of FIG. 3, the x=0 point is at the center point 18 of sample 15. However, in other exemplary embodiments, the x=0 point may be located at other positions on sample 15.

In some embodiments, the parabolic curve extends at least a distance of about 50 mm or more along sample 15. Therefore, when plotting the parabolic curve on x- and y-coordinates, the parabolic curve extends for a length of at least 50 mm along the x-axis. In other embodiments, the parabolic curve extends a distance of about 60 mm or more, or about 70 mm or about, or about 75 mm or more, or about 80 mm or more, or about 90 mm or more, or about 100 mm or more, or about 125 mm or more, or about 150 mm or more, or about 175 mm or more, or about 200 mm or more, or about 250 mm or more, or about 300 mm or more, or about 400 mm or more, or about 500 mm or more, or about 600 mm or more, or about 700 mm or more, or about 800 mm or more, or about 900 mm or more, or about 1000 mm or more, or about 1100 mm or more, or about 1200 mm or more, or about 1500 mm or more, or about 2000 mm or more along sample 15. The maximum distance that the parabolic curve extends along the x-axis is the longest length dimension (e.g., diagonal length) of the cross-section of sample 15.

In some embodiments, B is equal to zero so that the above equation is simplified to:

$$y = Ax^2 + C$$

The parabolic curves disclosed herein represent a best fit curve of the average hydroxyl concentration of segments 20. A quantifiable analysis of how well the different average hydroxyl concentrations of segments 20 fit the resulting parabolic curve is shown by the best fit value $R^2$, which is calculated using x and y as discussed above and the following equation:

$$R^2 = \frac{n\left(\sum xy\right) - \left(\sum x\right)\left(\sum y\right)}{\sqrt{\left[n\sum x^2 - \left(\sum x\right)^2\right]\left[n\sum y^2 - \left(\sum y\right)^2\right]}}$$

The best fit value $R^2$ of the parabolic curves disclosed herein is greater than or equal to 0.3, or greater than or equal to 0.4, or greater than or equal to 0.5, or greater than or equal to 0.6, or greater than or equal to 0.7, or greater than or equal to 0.8, or greater than or equal to 0.9, or about 1.0.

EXEMPLARY EXAMPLES

The following examples show the average hydroxyl concentrations for segments 20 and corresponding parabolic curves for glass samples according to the embodiments disclosed herein.

Figure 8A:
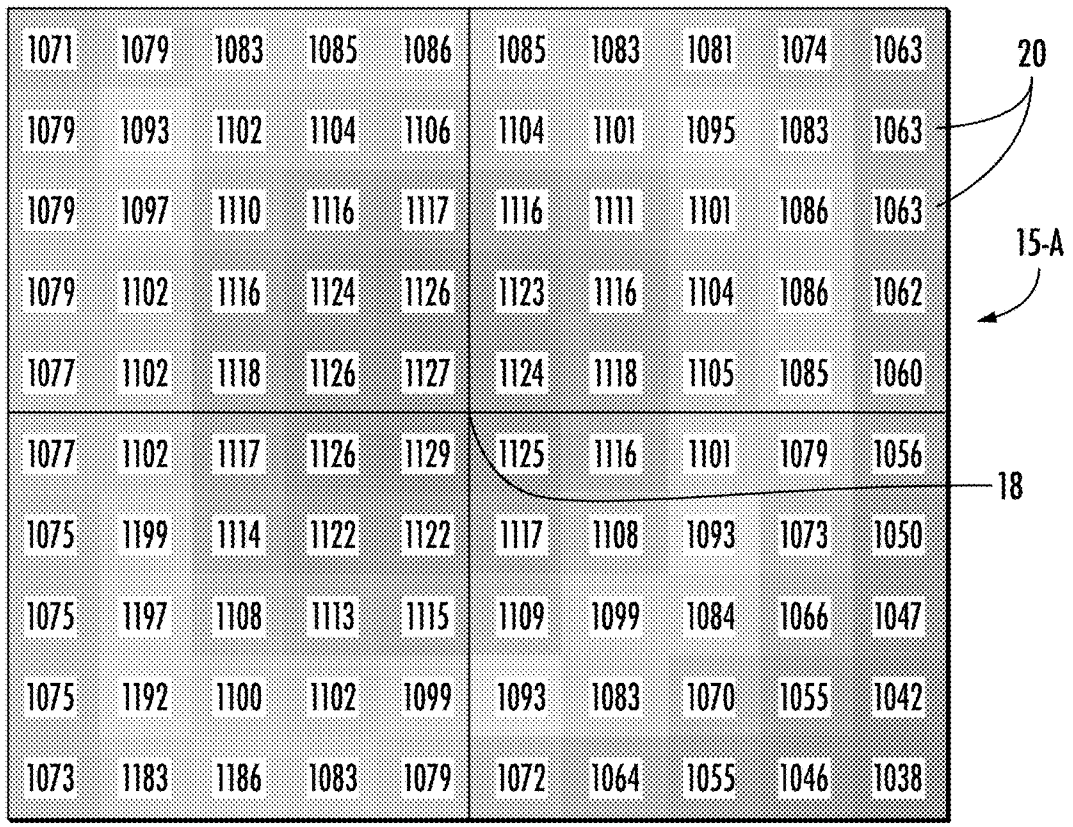
FIG. 8A shows a cross-section of an exemplary sample of a glass body divided into segments and the hydroxyl concentration of each segment, according to embodiments disclosed herein.

FIG. 8A shows an exemplary embodiment of a sample 15-A having a length (L) of 152.4 mm, a width (W) of 152.4 mm, and a height (h) of 7.62 mm. Sample 15-A is further divided into 100 segments 20. It is noted that sample 15-A comprises an outer, peripheral lip having a length of 12.7 mm, in which the sample is not divided into segments. Segments 20 of sample 15-A each have a length (L') and a width (W') of 12.7 mm and a height (h) of 7.62 mm. FIG. 8A shows the average hydroxyl concentration (in ppm) of each segment 20. As shown in FIG. 8A, the segments 20 with the highest concentration of hydroxyl are located near center 18 of sample 15-A, while the segments with the lowest concentration of hydroxyl are located closer to the outer peripheral edges of the sample.

Figure 8B:
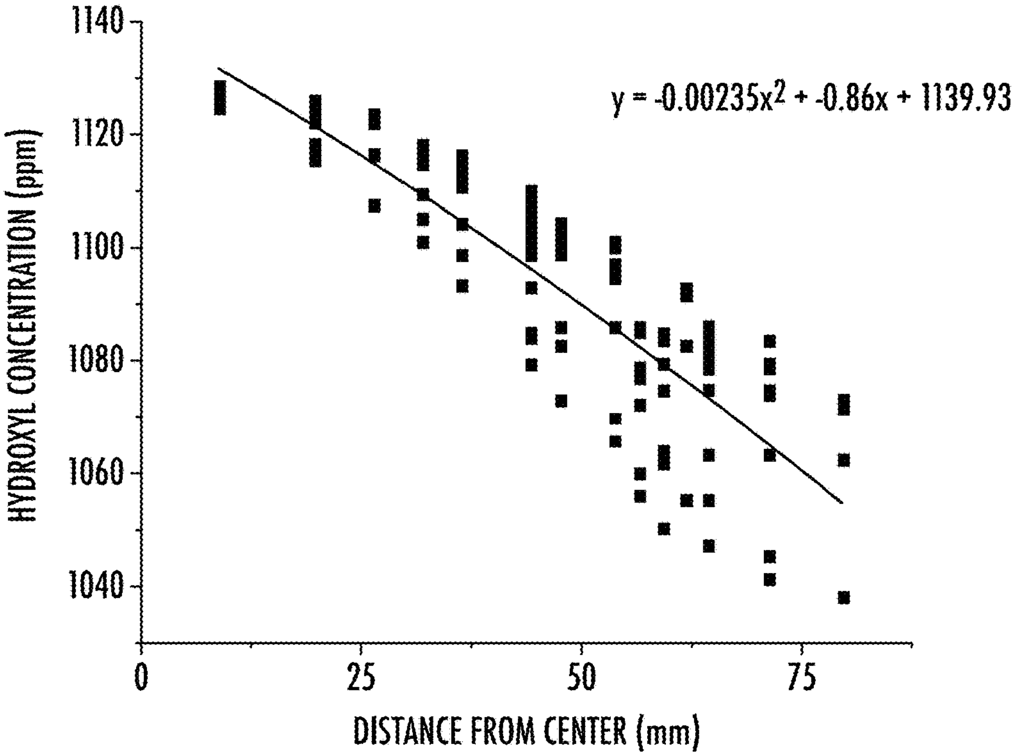
FIG. 8B shows a best fit parabolic curve of the hydroxyl concentration of each segment of FIG. 8A.

FIG. 8B shows the hydroxyl concentration of each segment 20 of sample 15-A plotted as a function of distance along sample 15-A. In this example, the x=0 point is at center point 18. The best fit parabolic curve of these data points is shown in FIG. 8B and is represented by the equation: $y=-0.00235x^2+-0.86x+1139.93$. The best fit value $R^2$ of this equation is 0.73.

Figure 9A:
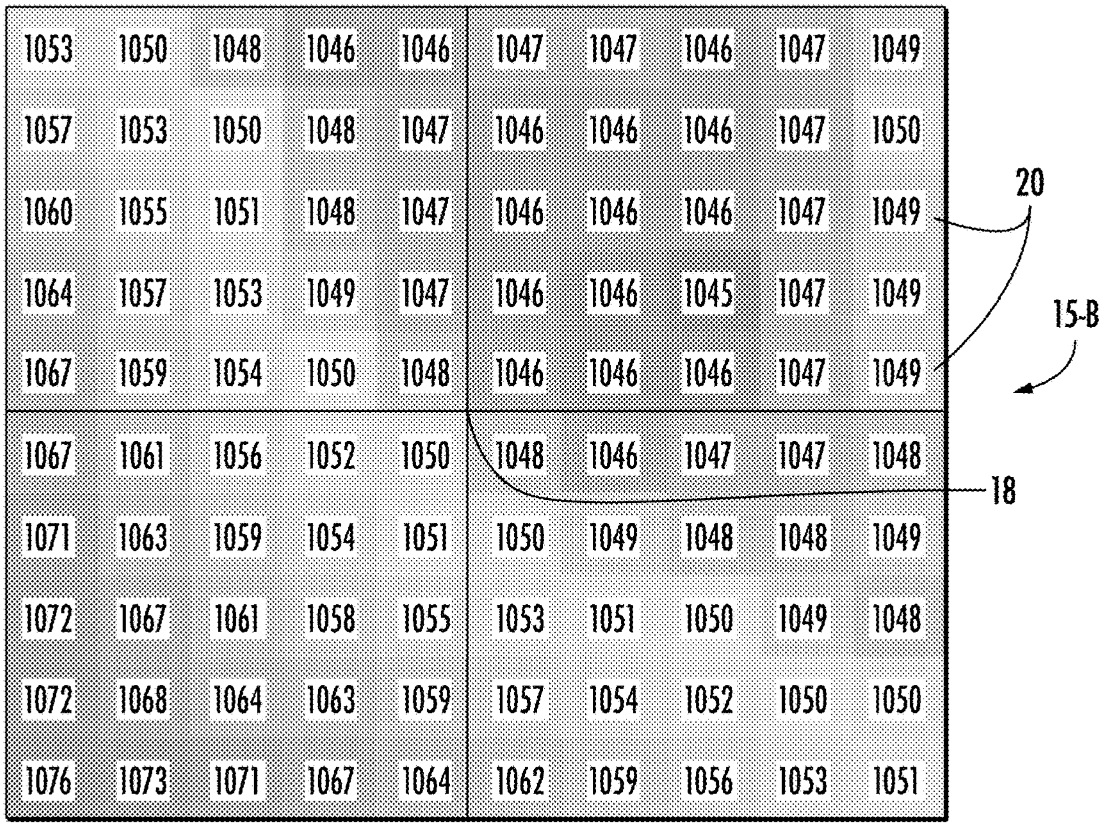
FIG. 9A shows another cross-section of an exemplary sample of a glass body divided into segments and the hydroxyl concentration of each segment, according to embodiments disclosed herein.

FIG. 9A shows an exemplary embodiment of a sample 15-B having a length (L) of 152.4 mm, a width (W) of 152.4 mm, and a height (h) of 7.62 mm. Sample 15-B is further divided into 100 segments 20. It is noted that sample 15-B comprises an outer, peripheral lip having a length of 12.7 mm, in which the sample is not divided into segments. Segments 20 of sample 15-B each have a length (L') and a width (W') of 12.7 mm and a height (h) of 7.62 mm. FIG. 9A shows the hydroxyl concentration (in ppm) of each segment 20. As shown in FIG. 9A, the segments 20 with the highest concentration of hydroxyl are located near the bottom left of sample 15-B, while the segments with the lowest concentration of hydroxyl are located near the top right of the sample.

Figure 9B:
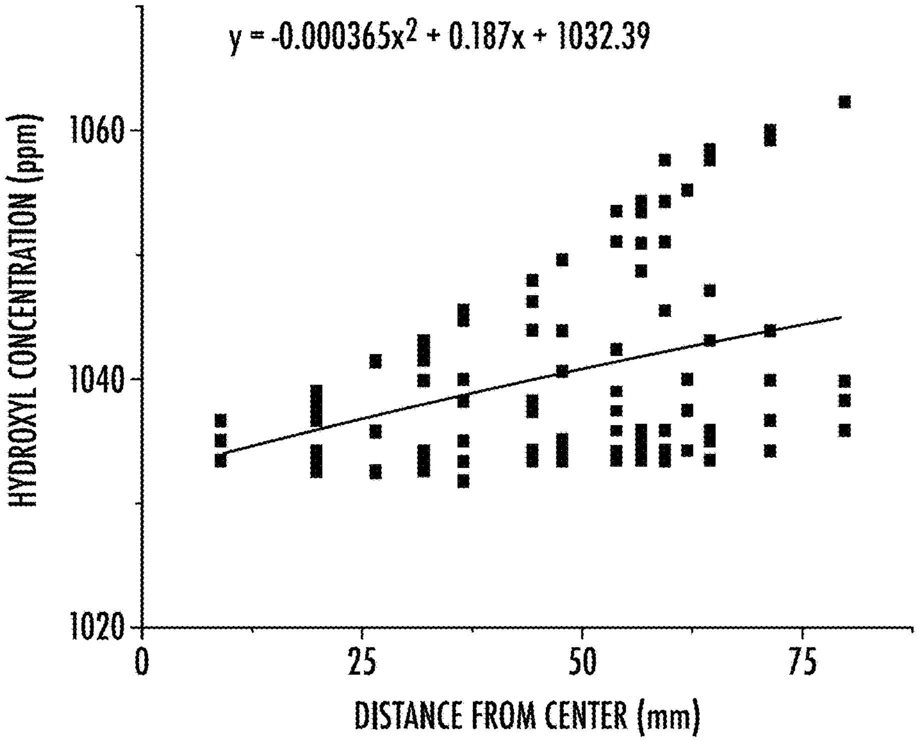
FIG. 9B shows a best fit parabolic curve of the hydroxyl concentration of each segment of FIG. 9A.

FIG. 9B shows the hydroxyl concentration of each segment 20 of sample 15-B plotted as a function of distance along sample 15-B. In this example, the x=0 point is at center point 18. The best fit parabolic curve of these data points is shown in FIG. 8B and is represented by the equation: $y=-0.000365x^2+0.187x+1032.39$. The best fit value $R^2$ of this equation is 0.11.

Figure 10A:
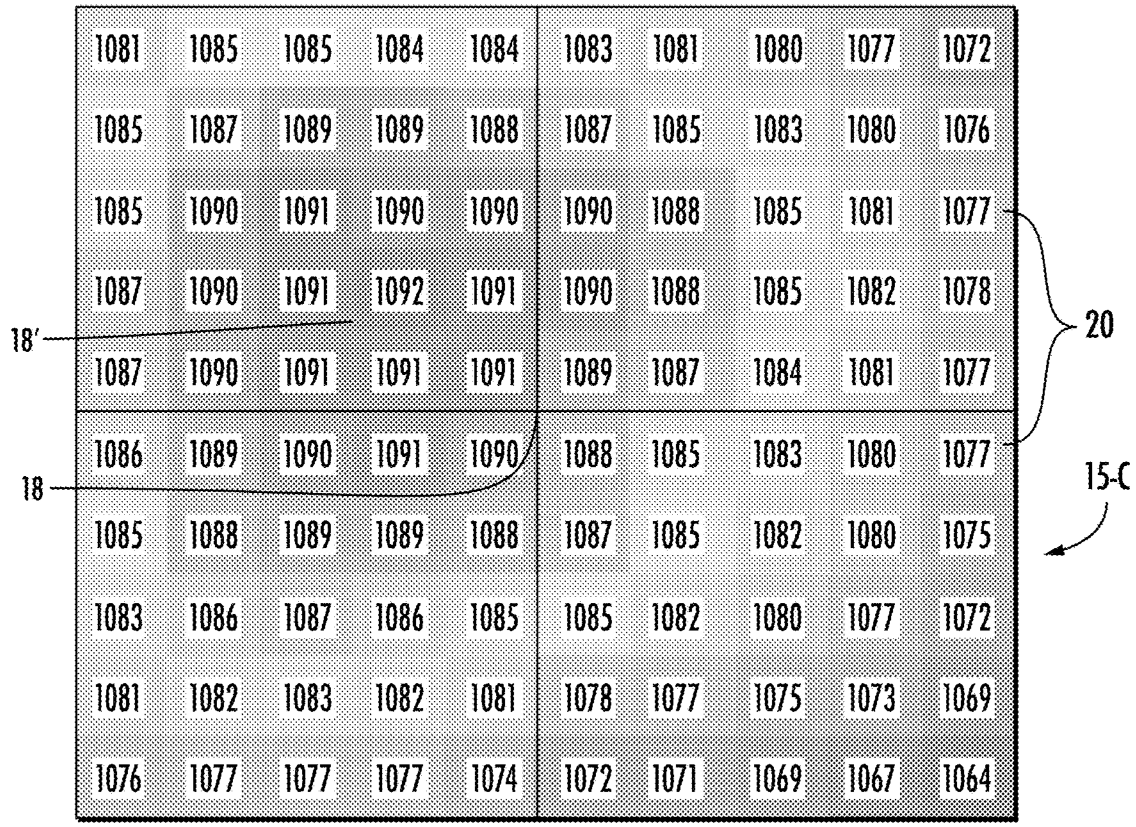
FIG. 10A shows another cross-section of an exemplary sample of a glass body divided into segments and the hydroxyl concentration of each segment, according to embodiments disclosed herein.

FIG. 10A shows an exemplary embodiment of a sample 15-C having a length (L) of 152.4 mm, a width (W) of 152.4 mm, and a height (h) of 7.62 mm. Sample 15-C is further divided into 100 segments 20. It is noted that sample 15-C comprises an outer, peripheral lip having a length of 12.7 mm, in which the sample is not divided into segments. Segments 20 of sample 15-C each have a length (L') and a width (W') of 12.7 mm and a height (h) of 7.62 mm. FIG. 10A shows the hydroxyl concentration (in ppm) of each segment 20. As shown in FIG. 10A, the segments 20 with the highest concentration of hydroxyl are located near but offset from center 18 of sample 15-C, while the segments with the lowest concentration of hydroxyl are located closer to the outer peripheral edges of the sample.

Figure 10B:
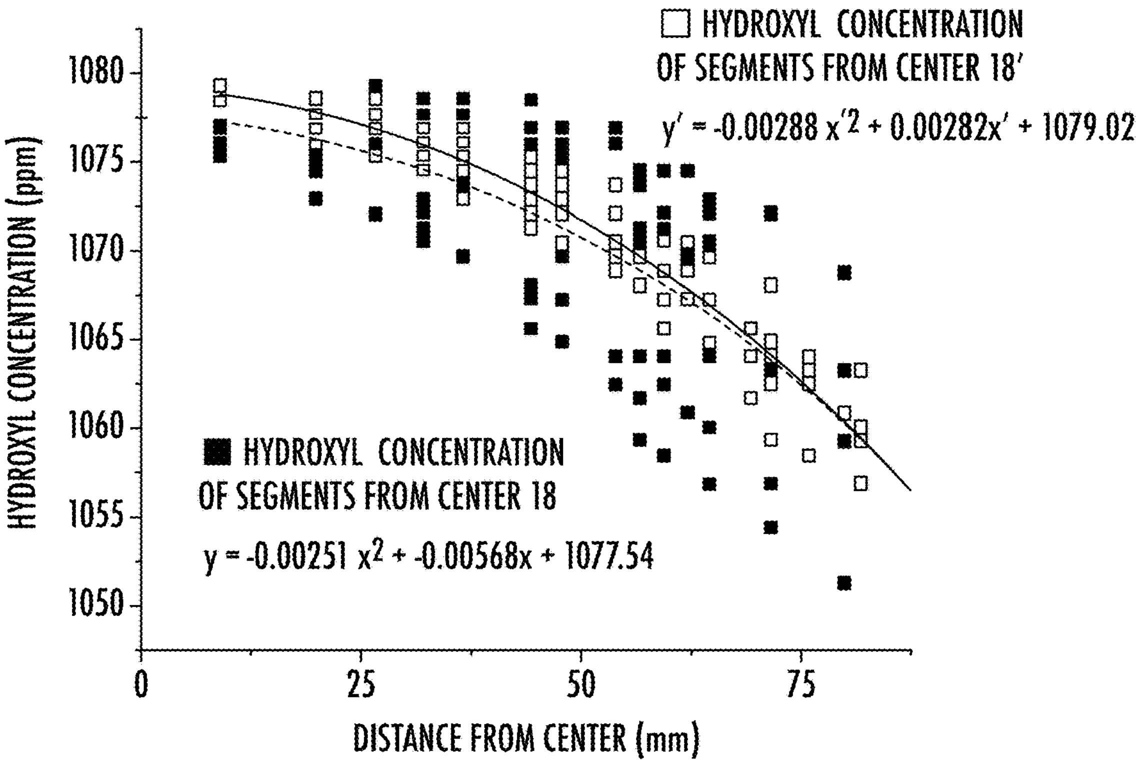
FIG. 10B shows two best fit parabolic curves of the hydroxyl concentration of each segment of FIG. 10A.

FIG. 10B shows the hydroxyl concentration of each segment 20 of sample 15-B plotted as a function of distance along sample 15-C. Most specifically, FIG. 10B shows a first plot of the hydroxyl concentration vs. distance along sample 15-C. In this first plot, the point x=0 is at center point 18, and the plot is represented by the equation: $y=-0.00251x^2+-0.00568x+1077.54$. The best fit value $R^2$ of this equation is 0.46. In the second plot shown in FIG. 10B, the point x=0 is at center point 18', and the plot is represented by the equation: $y'=-0.00288x'^2+0.00282x'+1079.02$. The best fit value $R^2$ of this equation is 0.94. It is noted that point x=0 of the second plot is at the segments with the highest hydroxyl concentration (rather than at the center point 18 of sample 15) and that the second plot has a better best fit value $R^2$ than the first plot.

Figure 13:
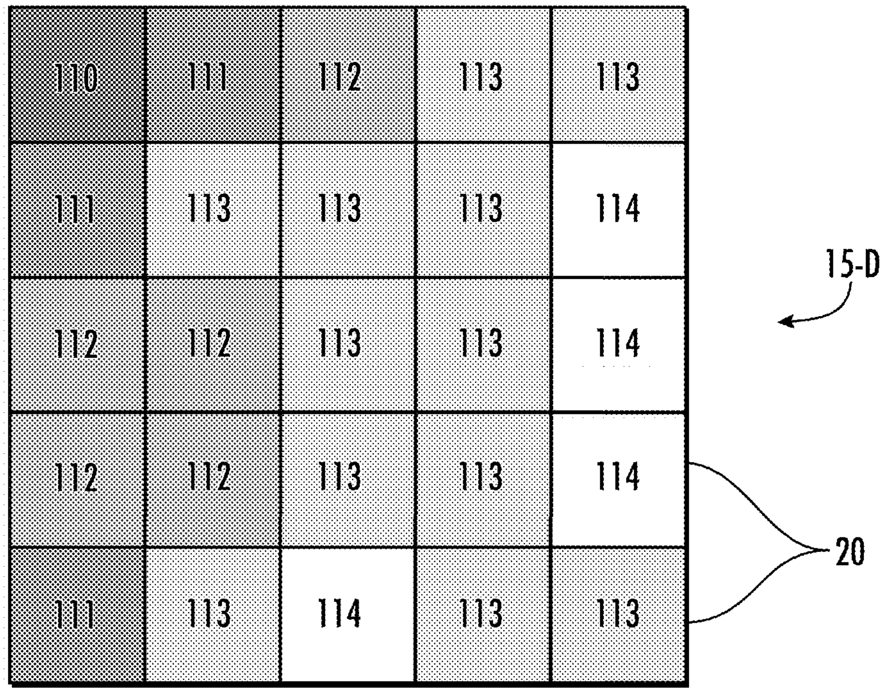

FIGS. 13-16 show exemplary samples of various sizes, each sample having a low P-V of hydroxyl concentration amongst the segments and, thus, a uniform concentration of hydroxyl along the sample. In particular sample 15-D of FIG. 13 has a length (L) of 127 mm, a width (W) of 127 mm, and a height (h) of 7.62 mm. It is noted that the hydroxyl concentration of sample 15-D was measured across the entire length (L) and width (W) of the sample. Furthermore, sample 15-D has a mass of 2.5 kg. As shown in FIG. 13, sample 15-D is divided into 25 segments, each of which has a length (L') and a width (W') of 25.4 mm. FIG. 13 shows the average hydroxyl concentration (in ppm) of each segment 20. The average hydroxyl concentration in sample 15-D is 112 ppm, and the P-V difference in hydroxyl concentration in sample 15-D is 4 ppm.

Figure 14:
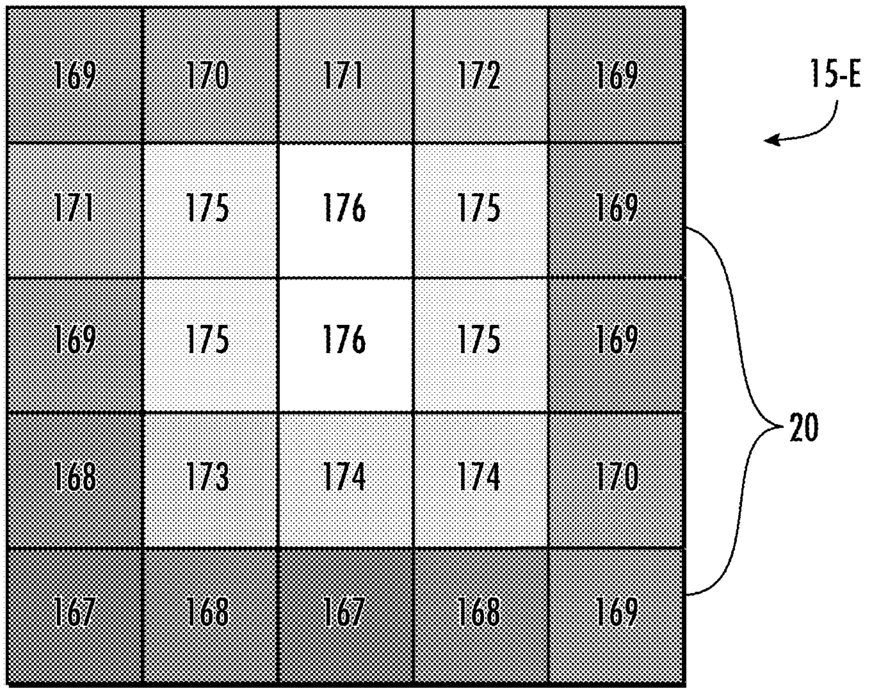

Sample 15-E of FIG. 14 has a length (L) of 127 mm, a width (W) of 127 mm, and a height (h) of 7.62 mm. It is noted that the hydroxyl concentration of sample 15-E was measured across the entire length (L) and width (W) of the sample. Furthermore, sample 15-E has a mass of 4.5 kg. As shown in FIG. 14, sample 15-E is divided into 25 segments, each of which has a length (L') and a width (W') of 25.4 mm. FIG. 14 shows the average hydroxyl concentration (in ppm) of each segment 20. The average hydroxyl concentration in sample 15-E is 171 ppm, and the P-V difference in hydroxyl concentration in sample 15-E is 9 ppm.

Sample 15-F of FIG. 15 has a length (L) of 279.4 mm, a width (W) of 279.4 mm, and a height (h) of 7.62 mm. It is noted that the hydroxyl concentration of sample 15-F was measured across the entire length (L) and width (W) of the sample. Furthermore, sample 15-F has a mass of 12 kg. As shown in FIG. 15, sample 15-F is divided into 100 segments, each of which has a length (L') and a width (W') of 27.94 mm. FIG. 15 shows the average hydroxyl concentration (in ppm) of each segment 20. The average hydroxyl concentration in sample 15-F is 155 ppm, and the P-V difference in average hydroxyl concentration in sample 15-F is 24 ppm.

Sample 15-G of FIG. 16 has a length (L) of 431.8 mm, a width (W) of 431.8 mm, and a height (h) of 7.62 mm. It is noted that the hydroxyl concentration of sample 15-G was measured across the entire length (L) and width (W) of the sample. Furthermore, sample 15-G has a mass of 36.5 kg. As shown in FIG. 16, sample 15-G is divided into 225 segments, each of which has a length (L') and a width (W') of 27.79 mm. FIG. 16 shows the average hydroxyl concentration (in ppm) of each segment 20. The average hydroxyl concentration in sample 15-G is 225 ppm, and the P-V difference in average hydroxyl concentration in sample 15-G is 97 ppm. It is noted that sample 15-G, in particular, comprises such a uniform hydroxyl concentration across the entirety of the sample with the sample having such a larger mass.

Exemplary Processes

Figure 11:
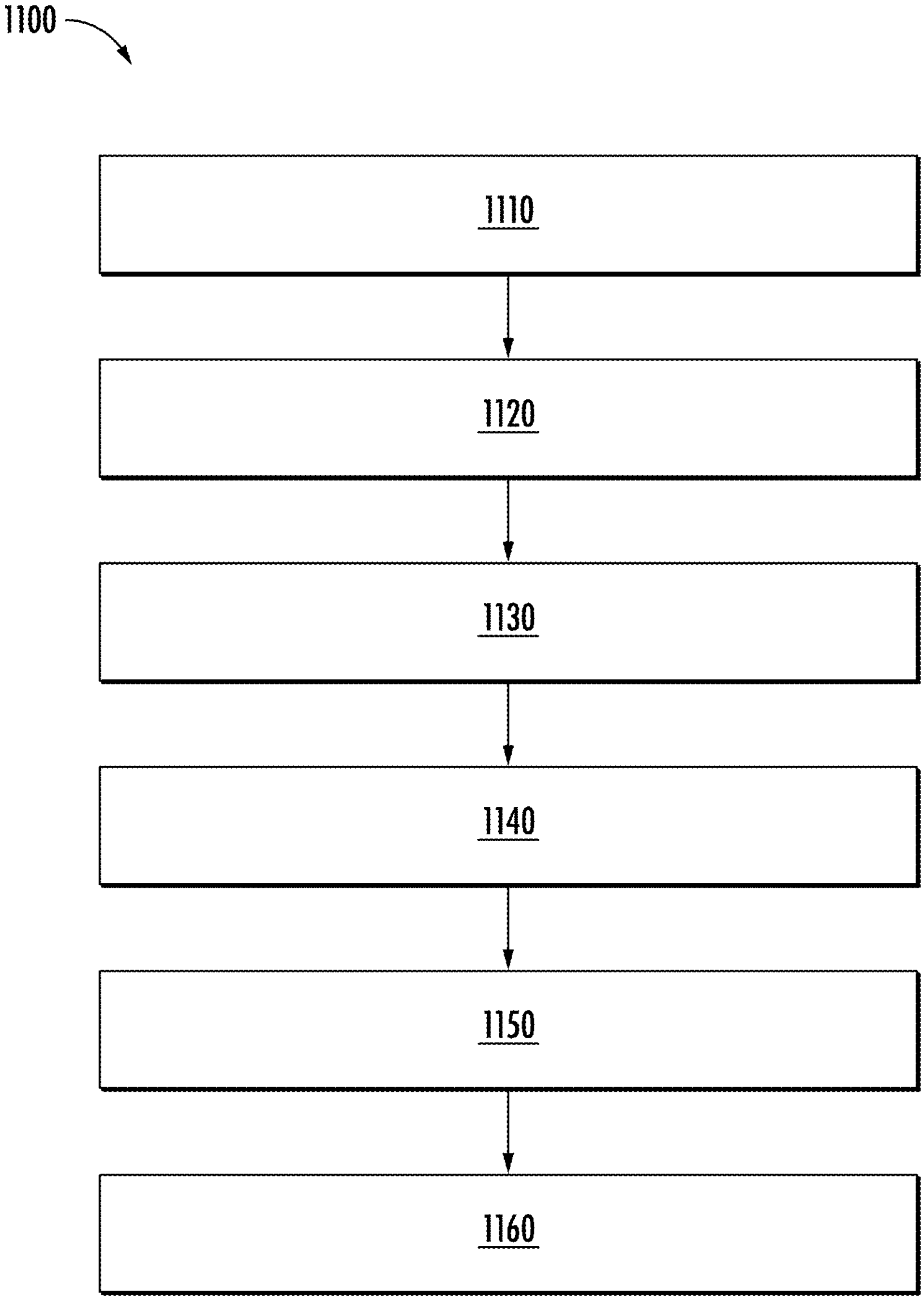
FIG. 11 shows a process to form glass bodies according to the embodiments disclosed herein.

FIG. 11 depicts a process 1100 to form glass body 10 according to the embodiments disclosed herein. As discussed above, the unique steps of process 1100 form glass body 10 with the distributions of hydroxyl concentration, titania concentration, Tzc, refractive index, and CTE, as discussed above. As shown in the process 1100 of FIG. 11, glass body 10 may be prepared, at step 1110, by combusting and oxidizing a mixture of a silica precursor and a titanium precursor to form loose soot particles. Each soot particle comprises $SiO_2$ and $TiO_2$.

Figure 12:
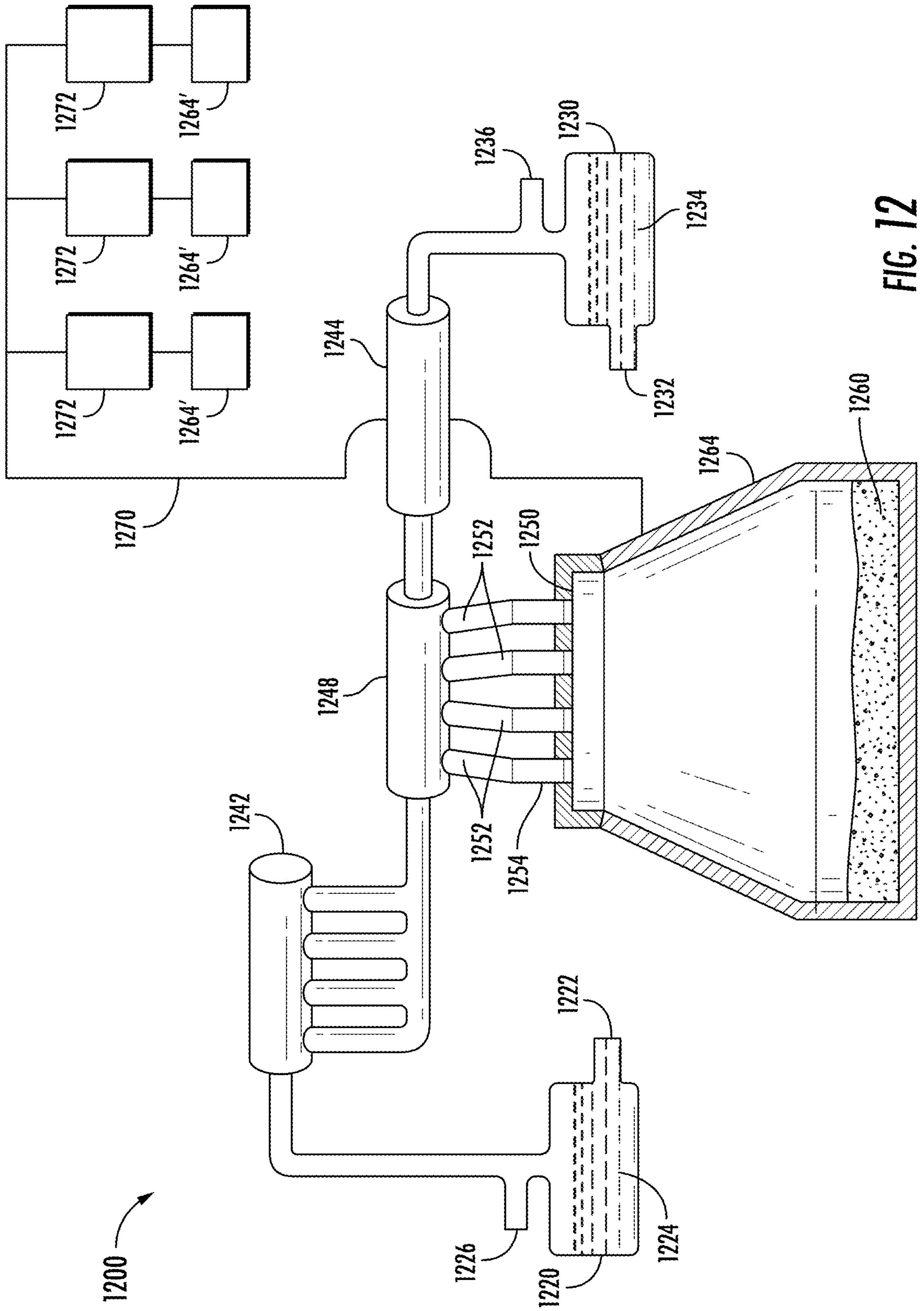

FIG. 12 depicts a schematic representation of a system 1200 to produce the loose soot particles. Referring to FIG. 12, system 1200 comprises a first reservoir 1220 that houses a silica precursor 1224 and a second reservoir 1230 that houses a titania precursor 1234. The temperatures of first and second reservoirs 1220, 1230 may be monitored such that the precursors within each reservoir are uniform and constant (i.e., within +/−0.5° C.) within the entirety of the reservoir. First reservoir 1220 includes an inlet 1222 for introduction of a carrier gas, such as nitrogen, at or near the base of the reservoir. The carrier gas forms a vaporous stream with the silica precursor 1224. Similarly, second reservoir 1230 includes an inlet 1232 for introduction of a carrier gas, such as nitrogen, at or near the base of the reservoir. The carrier gas in second reservoir 1230 forms a vaporous stream with the titania precursor 1234. The carrier gases flowing into inlets 1222, 1232 flow into the respective reservoirs 1220, 1230 at a consistent and uniform flow rate in order to avoid introduction of any perturbations into system 1200. More specifically, the carrier gases flowing into inlets 1222, 1232 flow at a flow rate within 5% of each other.

The silica precursor 1224 may comprise, for example, octamethylcyclotetrasiloxane, and the titania precursor 1234 may comprise titanium tetraisopropoxide, as discussed above.

Bypass streams of carrier gas are also introduced into system 1200 at inlets 1226 and 1236 to prevent saturation of the vaporous silica stream and the vaporous titania stream. In embodiments, the vaporous silica stream and the vaporous titania stream are heated by hot oil tracing to prevent hot and cold spots within the streams. It noted that both hot and cold spots within a vaporous stream affect the precursor concentrations in the stream, thus producing glass with suboptimal properties. The vaporous silica stream then passes through distribution system 1242 to manifold 1248, and the vaporous titania stream passes through distribution system 1244 to manifold 1248.

The silica and titania vaporous streams then mix in manifold 1248 to form a mixture of the two streams. As further shown in FIG. 12, the mixture of the two streams flows to furnace 1250. More specifically, the mixture of the two streams passes through fume lines 1252 to burners 1254 mounted in an upper portion of furnace 1250. The two streams are further joined with a fuel/oxygen mixture at burners 1254 to combust and oxidize the mixture. The fuel may be natural gas. The oxidation and combustion of the mixture forms loose soot particles 1260. The fuel/oxygen mixture is combined with the silica and titania vaporous streams at burners 1254 such that the amount of oxygen is at least in a 1:1 ratio with the amount of silica and titania vapor combined (including any carrier gases). Therefore, the amount of oxygen is at least equal to the amount of silica and titania vapor (including any carrier gases), or 2×, or 3×, or 4×, etc. the amount of silica and titania vapor (including any carrier gases).

At step 1120 of process 1100, the loose soot particles 1260 are then cooled and directed into a collection chamber. In some embodiments, the loose soot particles 1260 are directed into collection chamber 1264. In other embodiments, the loose soot particles 1260 are directed vertically upward through a tube 1270 rather than downward into collection chamber 1264. Tube 1270 may be a quartz tube, which carries soot particles 1260 in a vaporous stream to one or more filter bags 1272. The soot particles 1260 are removed from the vaporous stream by the filter bags 1272 and are then deposited into one or more collection chambers 1264'. For example, the soot particles 1260 fall downward from filter bags 1272 and into collection chambers 1264'. A pulse of $N_2$ may periodically be applied to filter bags 1272 to prevent the excess accumulation of soot particles 1260 on the bags. In some embodiments, collection chambers 1264' are stainless steel hoppers. The soot particles 1260 can then be further collected from collection chambers 1264' and deposited into barrels, where soot particles 1260 may be stored until further use.

In embodiments, the barometric pressure surrounding system 1200 was precisely monitored in order to produce a glass body with the optimal properties disclosed herein (e.g., uniform concentration of hydroxyl and titania). Furthermore, it was also found that frequent cleaning of the gas lines within system 1200 and frequent replacing of filter bags 1271 produce glass bodies with the optimal properties disclosed herein. Soot particles 1260 may also cool to about 200° C. or less, or about 175° C. or less, or about 150° C. or less, or about 125° C. or less, or about 100° C. or less, or about 75° C. or less, or about 50° C. or less, or about 25° C. or less, or about 20° C. or less before reaching collection chambers 1264, 1264' in order produce the optical properties disclosed herein in the glass body.

At step 1130 of process 1100, the soot particles are transported from the gallon barrels to a mold to form a molded precursor body. The mold is graphite with a very high cleanliness level (i.e., an impurity level of less than 100 ppm) in order to produce glass bodies with superior properties. The soot particles are pressed in the mold by a pressing apparatus to form the molded precursor body, which is then heat treated in the presence of steam or under vacuum pressure (i.e., pressure of less than 1 torr) to form a consolidated molded precursor body. In embodiments, the consolidated molded precursor body is opaque following the heat treatment step.

It is noted that in the embodiments in which the molded precursor body is heat treated under vacuum pressure, the body is not doped with hydroxide during step 1130 of process 1100. Therefore, such embodiments may be referred to as "no OH doping." In contrast, when heating the molded precursor body in the presence of steam (also referred to as steam doping, as discussed further below), the body is doped with hydroxide. The "no OH doping" process produces a glass body with a reduced hydroxyl concentration as compared to the stream doping process.

In yet other embodiments, the molded precursor body may be actively dried during the heat treatment step to form the consolidated molded precursor body. During such active drying embodiments, the molded precursor body is exposed to a drying agent while heating the molded precursor body in a furnace. In embodiments, the drying agent may be a halide, such as chloring and/or fluorine, or carbon monoxide. Actively drying the molded precursor body leads to a reduced concentration of hydroxyl in the glass body, even less when compared with the "no OH doping process."

It is further noted that in the "no OH doping" and steam doping processes, the precursor body may not be exposed to a halide agent. Therefore, in these embodiments, the final glass body may not comprise a halide such that the glass body is halide-free (i.e., may comprise less than 100 ppm of a halide).

Furthermore, during the consolidation heating of step 1130, the molded precursor body is heated in a furnace at a heating rate of about 2.5° C./hour or lower. Such slow heating helps to provide the uniform hydroxyl and titania concentrations in the produced glass body.

Step 1140 of process 1100 comprises melting the consolidated molded precursor body into a melt, flowing the melt into another mold, and then cooling the melt to form a glass. Once the glass is cooled, it forms a body. This body no longer has the opaqueness that was produced during the consolidation of step 1130.

At step 1150, the body is then exposed to an environment having an elevated temperature and an elevated pressure for a period of time. In some embodiments, the environment having the elevated temperature and the elevated pressure comprises an inert gas. By "inert gas," it is meant a gas that does not chemically react with the body. In some embodiments, the elevated pressure is in a range from 0.5 kpsi to 15 kpsi. Furthermore, in some embodiments, the elevated temperature is in a range from 1000° C. to 1800° C. The body may be subjected to the environment for a period of time in a range from 1 hour to 120 hours. The step 1150 of subjecting the body to the environment having the elevated pressure and the elevated temperature can be referred to as "hot isostatic pressing."

Step 1160 of process 1100 comprises an annealing step. During this step, internal stresses within the body are relaxed, which provides better quality cutting and machining of the body. In addition, step 1160 of annealing the body lowers the average Tzc of the body.

Referring again to step 1110 of process 1100, samples 15-A through 15-G (as discussed above) were prepared by flowing the vaporous silica stream and the vaporous titania steam through distribution system 1242 at a flow rate of 9 standard liter per minute (SLPM). As discussed above, the two vaporous streams are mixed together and then directed to burners 1254 of furnace 1250, where the mixed gas is combusted in the presence of oxygen. The oxygen that combusts the mixed gas flows from burner 1254 at a flow rate of 45 SLPM.

Steam Doping

As discussed above, in embodiments, the glass bodies of the present disclosure are comprised of titania-silica glass with a high concentration of hydroxyl. In particular, the glass bodies have been modified to include a high concentration of hydroxyl groups, which is achieved by consolidating the molded precursor glass bodies (during step 1130 of process 1100) in a steam-containing atmosphere.

Processing of the molded precursor glass bodies using a steam doping process includes thermal treatment in a steam-free atmosphere, exposing the thermally treated glass bodies to steam, and consolidation of the thermally treated glass bodies in a steam-containing atmosphere.

Thermal treatment of a glass body in a steam-free atmosphere enables purging and removal of gases from the body. The thermal treatment process may occur in a steam-free atmosphere at a temperature in a range from about 100° C. to about 900° C., or about 200° C. to about 700° C., or about 300° C. to about 600° C. The steam-free atmosphere may further include an inert gas. Furthermore, the thermal treatment may occur for an amount of time sufficient to increase an internal temperature of the body to at least 100° C., or at least 200° C., or in a range from about 100° C. to about 600° C., or about 100° C., to about 500° C., or about 150° C. to about 600° C.

After thermal treatment in the steam-free atmosphere, the body is then exposed to a steam-containing atmosphere to load the body with hydroxyl groups. The steam-containing atmosphere may include only steam or steam in combination with an inert gas. The pressure of the steam may be from about 0.1 atm to about 10 atm, or about 0.5 atm to about 5 atm. The steam pressure should be constant within the furnace with any pressure difference being only +/−2% of the absolute pressure in the furnace. The temperature at which the body is exposed to the steam-containing atmosphere may be in the range from about 200° C. to about 900° C., or from about 300° C. to about 700° C. The temperature is preferably less than a temperature that induces densification or consolidation of the body. The time of exposure of the body to the steam-containing atmosphere can be adjusted to control the concentration of hydroxyl groups incorporated into the body. Longer exposure times lead to higher concentrations of hydroxyl.

After exposure of the body to the steam-containing atmosphere, the body is consolidated in the presence of steam. The steam-containing consolidation atmosphere may have the same composition as the steam-containing loading atmosphere (as described above). Consolidation of the body in the steam-containing atmosphere occurs at a temperature for a sufficient time to transform the body from a porous body to a body having closed pores. The temperature may be in a range from about 900° C. to about 1850° C., or about 900° C. to about 1700° C., or about 900° C. to about 1500° C., or about 900° C. to about 1300° C. The time of exposure of the body to the steam-containing consolidation atmosphere may be at least 0.5 hours, or at least 1 hour, or at least 2 hours, or at least 5 hours. The heating rate may be from about 3° C./min to about 100° C./min, or about 5° C./min to about 50° C./min.

The steam consolidation step may include holding the body at a fixed temperature (a holding temperature) for a pre-determined amount of time. The holding temperature may be from about 1000° C. to about 1250° C., or about 1150° C. to about 1200° C. such that the temperature is increased at a heating rate of about 2.5° C./hour or higher. A peak holding temperature during the steam consolidation step is about 1250° C. The body may be held at the holding temperature for a duration of about 1 hour to about 240 hours, or between about 5 hours and about 20 hours.

The above-disclosed steam consolidation process converts the molded precursor body to a consolidated glass. After the steam consolidation process, the glass is then melted, as discussed above with regard to step 1140 of process 1100.

The use of steam in the above-disclosed steam doping process offers many benefits including the benefit of high hydroxyl concentration in the glass, which reduces viscosity and promotes low fictive temperature, and the avoidance of seed formation in the glass.

Additional embodiments of the above-disclosed steam consolidation process are disclosed in U.S. Pat. No. 9,580,350, which is incorporated by reference in its entirety.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It will be apparent to those skilled in the art that various modifications and variations can be made without departing from the spirit or scope of the illustrated embodiments. Since modifications, combinations, sub-combinations and variations of the disclosed embodiments that incorporate the spirit and substance of the illustrated embodiments may occur to persons skilled in the art, the description should be construed to include everything within the scope of the appended claims and their equivalents.

What is claimed is:

1. A glass comprising:

titania and silica, wherein:

the glass comprises a length and a width, a plot of average hydroxyl concentration of each segment of a plurality of segments vs. distance along the length and width of the glass is provided by:

$$y = Ax^2 + Bx + C,$$

A (in ppm/mm$^2$) is in a range from about −0.1 to about 0.5, B (in ppm/mm) is in a range from about −10 to about −0.1 or from about 1 to about 10, C (in ppm) is about 450 or less, y is the average hydroxyl concentration (in ppm), and x is distance (in mm), each segment comprises a length of 12.7 mm and a width of 12.7 mm along the glass, the hydroxyl concentration of each segment is measured using a Fourier transform infrared spectroscopy in transmission, and the plot extends a distance of about 50 mm or more along the length and width of the glass.

2. The glass according to claim 1, wherein C is in a range from about 75 to about 450.

3. The glass according to claim 2, wherein C is in a range from about 80 to about 150.

4. The glass according to claim 1, wherein B is in a range from about −5 to about −0. 1 or about 1 to about 5.

5. The glass according to claim 4, wherein A is about 0.

6. The glass according to claim 1, wherein A is in a range from about 0.0 to about −0.04.

7. The glass according to claim 6, wherein A is in a range from about 0.0 to about −0.02.

8. The glass according to claim 1, wherein a best fit value $R^2$ of the plot is greater than or equal to 0.3.

9. The glass according to claim 8, wherein the best fit value $R^2$ of the plot is greater than or equal to 0.5.

10. The glass according to claim 1, wherein the plot extends a distance of about 75 mm or more along the length and width of the glass.

11. The glass according to claim 10, wherein the plot extends a distance of about 100 mm or more along the length and width of the glass.

12. The glass according to claim 1, wherein the plurality of segments includes every adjacent segment across a distance of about 25 mm or more along the length and width of the glass.

13. The glass according to claim 12, wherein the length of the glass is about 50 mm or more and the width of the glass is about 50 mm or more.

14. The glass according to claim 1, wherein the glass is a photomask.

15. The glass according to claim 1, wherein the segments with relatively higher hydroxyl concentration have relatively lower zero temperature crossing as compared to the other segments.

16. The glass according to claim 1, wherein an average hydroxyl concentration of the plurality of segments is about 200 ppm or less.

17. A glass comprising:

titania and silica, wherein:

the glass comprises a length and a width, a plot of average hydroxyl concentration of each segment of a plurality of segments vs. distance along the length and width of the glass is provided by:

$$y = Ax^2 + Bx + C,$$

A (in ppm/mm$^2$) is in a range from about −0.1 to about 0.5, B (in ppm/mm) is in a range from about −10 to about −0.1 or from about 1 to about 10, and C (in ppm) is about 800 or greater, y is the average hydroxyl concentration (in ppm), and x is distance (in mm), each segment comprises a length of 12.7 mm and a width of 12.7 mm along the glass, the hydroxyl concentration of each segment is measured using a Fourier transform infrared spectroscopy in transmission, and the plot extends a distance of about 50 mm or more along the length and width of the glass.

18. The glass according to claim 17, wherein C is in a range from about 800 to about 1300.

19. The glass according to claim 17, wherein B is in a range from about −5 to about −0.1 or from about 1 to about 5.

20. A glass comprising:

titania and silica, wherein:

the glass comprises a length and a width, a plot of average hydroxyl concentration of each segment of a plurality of segments vs. distance along the length and width of the glass is provided by:

$$y = Ax^2 + Bx + C,$$

A (in ppm/mm$^2$) is in a range from about −0.1 to about 0.5, B (in ppm/mm) is in a range from about −10 to about −0.1 or from about 1 to about 10, C (in ppm) is undefined, y is the average hydroxyl concentration (in ppm), and x is distance (in mm), each segment comprises a length of 12.7 mm and a width of 12.7 mm along the glass, the hydroxyl concentration of each segment is measured using a Fourier transform infrared spectroscopy in transmission, and the plot extends a distance of about 50 mm or more along the length and width of the glass.

21. The glass according to claim 1, wherein A (in ppm/mm$^2$) is in a range from about −0.1 to about 0.0.

22. The glass according to claim 1, wherein A (in ppm/mm$^2$) is in a range from about 0.0 to about 0.1.

23. The glass according to claim 17, wherein A (in ppm/mm$^2$) is in a range from about −0.1 to about 0.0.

24. The glass according to claim 17, wherein A (in ppm/mm$^2$) is in a range from about 0.0 to about 0.1.

25. The glass according to claim 1, wherein the segments extend for less than an entire length and width of the glass.

26. The glass according to claim 17, wherein the segments extend for less than an entire length and width of the glass.

27. The glass according to claim 20, wherein the segments extend for less than an entire length and width of the glass.

28. A glass comprising:

titania and silica, wherein:

the glass comprises a length and a width, a plot of average hydroxyl concentration of each segment of a plurality of segments vs. distance along the length and width of the glass is provided by:

$$y = Ax^2 + Bx + C,$$

A (in ppm/mm$^2$) is in a range from about −20 to about −0.000365, B (in ppm/mm) is in a range from about −10 to about 10, C (in ppm) is undefined, y is the average hydroxyl concentration (in ppm), and x is distance (in mm), each segment comprises a length of 12.7 mm and a width of 12.7 mm along the glass, the hydroxyl concentration of each segment is measured using a Fourier transform infrared spectroscopy in transmission, and the plot extends a distance of about 50 mm or more along the length and width of the glass.

29. A glass comprising:

titania and silica, wherein:

the glass comprises a length and a width, a plot of average hydroxyl concentration of each segment of a plurality of segments vs. distance along the length and width of the glass is provided by:

$$y = Ax^2 + Bx + C,$$

A (in ppm/mm$^2$) is in a range from about −0.1 to about 0.5 and B (in ppm/mm) is in a range from about −10 to about 10 such that both A and B are not 0, C (in ppm) is undefined, y is the average hydroxyl concentration (in ppm), and x is distance (in mm), each segment comprises a length of 12.7 mm and a width of 12.7 mm along the glass, the hydroxyl concentration of each segment is measured using a Fourier transform infrared spectroscopy in transmission, and the plot extends a distance of about 50 mm or more along the length and width of the glass.

* * * * *